US011981882B2

(12) United States Patent
Kamimura

(10) Patent No.: US 11,981,882 B2
(45) Date of Patent: May 14, 2024

(54) CHEMICAL LIQUID AND CHEMICAL LIQUID STORAGE BODY

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1106 days.

(21) Appl. No.: 16/732,703

(22) Filed: Jan. 2, 2020

(65) Prior Publication Data

US 2020/0131118 A1    Apr. 30, 2020

Related U.S. Application Data

(63) Continuation of application No. PCT/JP2018/025534, filed on Jul. 5, 2018.

(30) Foreign Application Priority Data

Jul. 5, 2017 (JP) .................................. 2017-131768
Jun. 29, 2018 (JP) .................................. 2018-125027

(51) Int. Cl.
| | | |
|---|---|---|
| C11D 3/26 | (2006.01) |
| B65D 23/02 | (2006.01) |
| C07C 233/00 | (2006.01) |
| C07C 233/05 | (2006.01) |
| C11D 3/32 | (2006.01) |

(Continued)

(52) U.S. Cl.
CPC .............. *C11D 7/5004* (2013.01); *C11D 3/32* (2013.01); *C11D 3/43* (2013.01); *C11D 7/3263* (2013.01);

(Continued)

(58) Field of Classification Search
CPC ........... C11D 3/2006; C11D 3/26; C11D 3/32; C11D 3/43; C11D 7/3263; C11D 7/50;

(Continued)

(56) References Cited

U.S. PATENT DOCUMENTS

| 6,733,637 | B1 | 5/2004 | Burton et al. |
| 11,326,048 | B2 * | 5/2022 | Kamimura .......... B65D 1/0207 |

(Continued)

FOREIGN PATENT DOCUMENTS

| JP | 2003-535836 A | 12/2003 |
| JP | 2013-218308 A | 10/2013 |

(Continued)

OTHER PUBLICATIONS

International Search Report dated Oct. 9, 2018, issued by the International Searching Authority in application No. PCT/JP2018/025534.

(Continued)

*Primary Examiner* — Brian P Mruk
(74) *Attorney, Agent, or Firm* — Sughrue Mion, PLLC

(57) ABSTRACT

An object of the present invention is to provide a chemical liquid having excellent defect inhibition performance and a chemical liquid storage body. The chemical liquid according to an embodiment of the present invention is a chemical liquid containing an organic solvent that has a conductivity equal to or lower than $10^{-5}$ S/m at 25° C., and a compound represented by General Formula (I), in which a content of the compound represented by General Formula (I) with respect to the total mass of the chemical liquid is 0.10 mass ppt to 100,000 mass ppt.

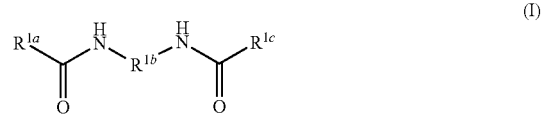

(I)

21 Claims, 2 Drawing Sheets

(51) Int. Cl.
　　　*C11D 3/43*　　(2006.01)
　　　*C11D 7/32*　　(2006.01)
　　　*C11D 7/50*　　(2006.01)
　　　*G03F 7/16*　　(2006.01)
　　　*G03F 7/26*　　(2006.01)
　　　*G03F 7/32*　　(2006.01)
　　　*H01L 21/306*　(2006.01)

(52) U.S. Cl.
　　　CPC ............... *G03F 7/325* (2013.01); *G03F 7/16* (2013.01); *H01L 21/30604* (2013.01)

(58) Field of Classification Search
　　　CPC ..... B65D 23/02; C07C 233/00; C07C 233/05; G03F 7/16; G03F 7/26; G03F 7/32; G03F 7/325
　　　See application file for complete search history.

(56) References Cited

U.S. PATENT DOCUMENTS

| | | |
|---|---|---|
| 2016/0026088 A1 | 1/2016 | Yamanaka et al. |
| 2016/0089622 A1 | 3/2016 | Takashima et al. |
| 2019/0033718 A1 | 1/2019 | Kamimura |
| 2019/0219924 A1* | 7/2019 | Kamimura ........... B01D 71/641 |

FOREIGN PATENT DOCUMENTS

| | | |
|---|---|---|
| JP | 2015-084122 A | 4/2015 |
| JP | 2016-071020 A | 5/2016 |
| JP | 2016-073922 A | 5/2016 |
| WO | 2014/162912 A1 | 10/2014 |
| WO | 2017/175856 A1 | 10/2017 |

OTHER PUBLICATIONS

Written Opinion dated Oct. 9, 2018, issued by the International Searching Authority in application No. PCT/JP2018/025534.

International Preliminary Report on Patentability dated Jan. 7, 2020, issued by the International Bureau in application No. PCT/JP2018/025534.

* cited by examiner

CHEMICAL LIQUID AND CHEMICAL LIQUID STORAGE BODY

CROSS-REFERENCE TO RELATED APPLICATIONS

This application is a Continuation of PCT International Application No. PCT/JP2018/025534 filed on Jul. 5, 2018, which claims priority under 35 U.S.C. § 119(a) to Japanese Patent Application No. 2017-131768 filed on Jul. 5, 2017 and Japanese Patent Application No. 2018-125027 filed on Jun. 29, 2018. Each of the above applications is hereby expressly incorporated by reference, in its entirety, into the present application.

BACKGROUND OF THE INVENTION

1. Field of the Invention

The present invention relates to a chemical liquid and a chemical liquid storage body.

2. Description of the Related Art

At the time of manufacturing semiconductor devices, a chemical liquid containing a solvent is used.

In recent years, there has been a demand for a further reduction in impurities such as metal components contained in the solvent. In addition, the manufacturing of semiconductor devices at a node equal to or smaller than 10 nm is being examined, and accordingly, the aforementioned demand is increasing.

The chemical liquid is supplied as a chemical liquid storage body stored in a container, taken out of the container at the time of manufacturing semiconductor devices, and used.

For example, JP2015-084122A discloses a chemical liquid manufactured by a predetermined method and the like.

SUMMARY OF THE INVENTION

As a result of examining conventional chemical liquids, the inventors of the present invention have found that the defect inhibition performance need to be improved.

An object of the present invention is to provide a chemical liquid having excellent defect inhibition performance.

Another object of the present invention is to provide a chemical liquid storage body.

In order to achieve the aforementioned objects, the inventors of the present invention carried out an intensive examination. As a result, the inventors have found that the object can be achieved by the following constitution.

(1) A chemical liquid containing an organic solvent that has a conductivity equal to or lower than $10^{-5}$ S/m at 25° C. and a compound represented by General Formula (I) which will be described later, in which a content of the compound represented by General Formula (I) with respect to the total mass of the chemical liquid is 0.10 mass ppt to 100,000 mass ppt.

(2) The chemical liquid described in (1) in which a boiling point of the compound represented by General Formula (I) is equal to or higher than 300° C.

(3) the chemical liquid described in (1) or (2) containing two or more kinds of the compound represented by General Formula (I).

(4) The chemical liquid described in any one of (1) to (3) further containing at least one kind of organic compound selected from the group consisting of compounds represented by General Formula (II) to General Formula (IV) which will be described later.

(5) The chemical liquid described in (4), in which the total content of the organic compound with respect to the total mass of the chemical liquid is 0.1 mass ppt to 100,000 mass ppt.

(6) The chemical liquid described in any one of (1) to (5), further containing metal components, in which a content of the metal components with respect to the total mass of the chemical liquid is 0.01 to 500 mass ppt.

(7) The chemical liquid described in (4) or (5), further containing metal components, in which a ratio of the total content of the compounds represented by General Formula (I) to General Formula (IV) with respect to the content of the metal components is 0.00001 to 10.

(8) The chemical liquid described in any one of (1) to (7), in which the organic solvent is at least one kind of compound selected from the group consisting of butyl acetate, isoamyl acetate, and 4-methyl-2-pentanol.

(9) A chemical liquid storage body having a container and the chemical liquid described in any one of (1) to (8) that is stored in the container.

(10) The chemical liquid storage body described in (9), in which the container contains at least one kind of component selected from the group consisting of polyethylene, polypropylene, and a polymer containing fluorine atoms.

(11) The chemical liquid storage body described in (9) or (10), in which the container contains a polymer containing fluorine atoms, an atom number ratio $X_1$ of the number of fluorine atoms contained in at least a surface of a portion of the container to the number of carbon atoms contained in the surface is 0.50 to 3.0, an atom number ratio $X_2$ of the number of fluorine atoms contained in a position 10 nm below the surface in a thickness direction of the container to the number of carbon atoms contained in the same position satisfies $X_1 > X_2$, and $X_1$ and $X_2$ are measured by time-of-flight secondary ion mass spectrometry.

(12) The chemical liquid storage body described in (10) or (11), in which the polymer containing fluorine atoms is at least one kind of compound selected from the group consisting of polytetrafluoroethylene, perfluoroalkoxyalkane, a tetrafluoroethylene*hexafluoropropylene copolymer, an ethylene*tetrafluoroethylene copolymer, an ethylene*chlorotrifluoroethylene copolymer, polychlorotrifluoroethylene, polyvinylidene fluoride, and polyvinyl fluoride.

(13) The chemical liquid storage body described in any one of (9) to (12), in which the container satisfies a condition 1 in a test which will be described later.

(14) The chemical liquid storage body described in any one of (9) to (13), in which the container satisfies a condition 2 in a test which will be described later.

(15) The chemical liquid storage body described in any one of (9) to (14), in which the container satisfies a condition 3 in a test which will be described later.

(16) A chemical liquid storage body described in any one of (9) to (15), in which the container is formed of a composition that contains a polymer containing fluorine atoms and a nanocarbon material, provided that an integrated intensity of a peak resulting from C=C stretching vibration confirmed in a range of 1,500 to 1,800 cm$^{-1}$ is $I_1$ and an integrated intensity of a peak resulting from C—H stretching vibration confirmed in a range of 2,800 to 3,500 cm$^{-1}$ is $I_2$, $M_1$ represented by Formula (1): $M_1 = I_1/(I_1+I_2)$ is 0.05 to 0.5, and the peaks are determined by atomic force microscopy infrared spectroscopy in at least a surface of a portion of the container.

(17) The chemical liquid storage body described in (16), in which an atom number ratio $X_1$ of the number of fluorine atoms contained in at least a surface of at least a portion of the container and the number of carbon atoms contained in the surface is 0.50 to 3.0, $X_1$ is measured by time-of-flight secondary ion mass spectrometry, provided that an integrated intensity of a peak resulting from C=C stretching vibration confirmed in a range of 1,500 to 1,800 cm$^{-1}$ is $I_3$ and an integrated intensity of a peak resulting from C—H stretching vibration confirmed in a range of 2,800 to 3,500 cm$^{-1}$ is 14, $M_2$ represented by Formula (3): $M_2=I_3/(I_3+I_4)$ satisfies Formula (4): $M_1<M_2$, and the peaks are determined using a scattering-type near field microscope.

(18) The chemical liquid storage body described in (16) or (17), in which a content of the nanocarbon material with respect to the total mass of the composition is 0.001% to 0.5% by mass.

(19) The chemical liquid storage body described in any one of (16) to (18), in which the nanocarbon material is carbon nanotubes.

(20) The chemical liquid storage body described in (19), in which a major axis of the carbon nanotubes is 0.01 to 1,000 m.

(21) The chemical liquid storage body described in any one of (9) to (20), further having a lid put on the container.

According to the present invention, a chemical liquid having excellent defect inhibition performance can be provided.

Furthermore, according to the present invention, a chemical liquid storage body can be provided.

DESCRIPTION OF THE PREFERRED EMBODIMENTS

Figure 1:
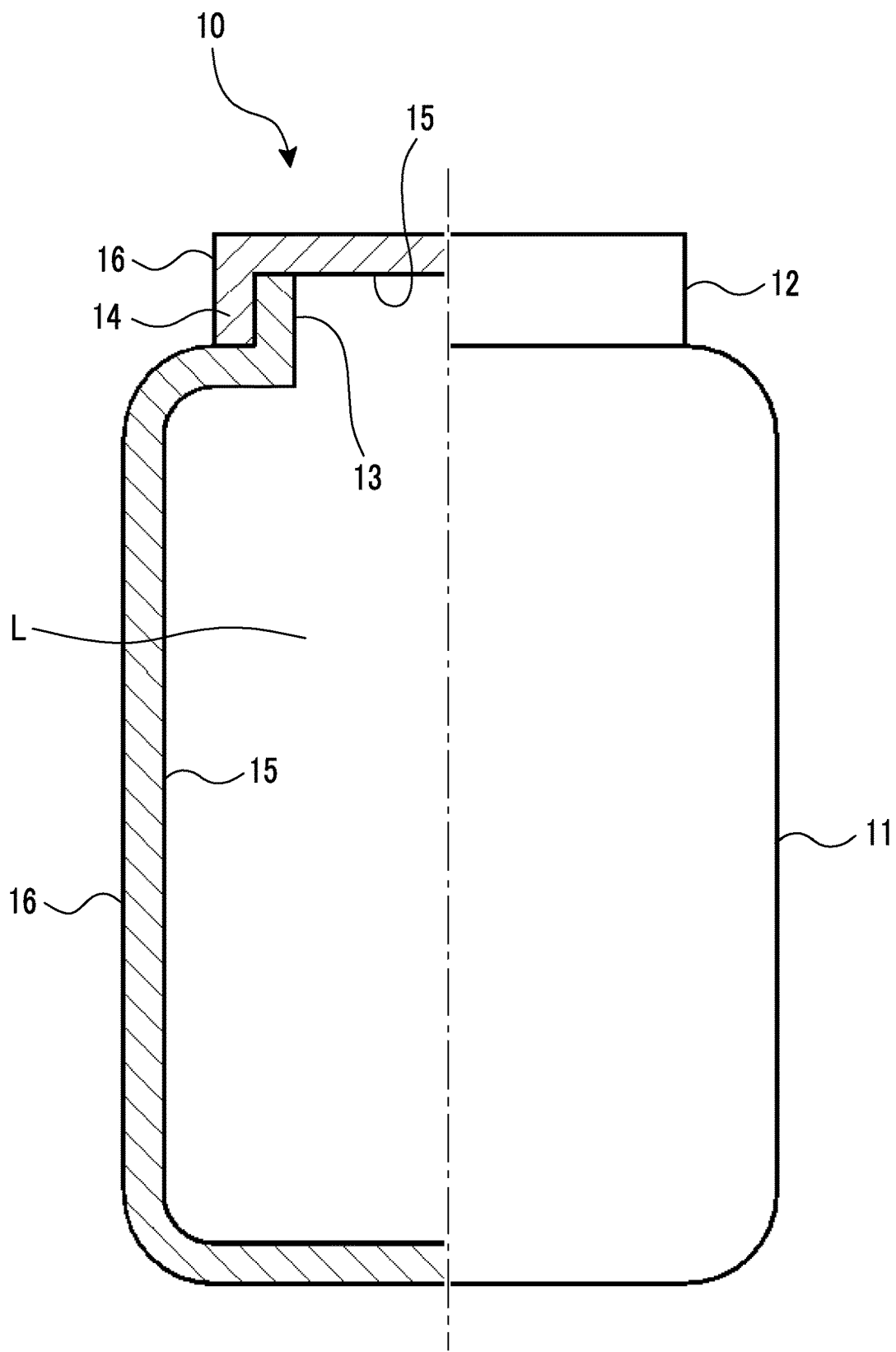
FIG. 1 is a partial cross-sectional view showing an example of a container with a lid included in a chemical liquid storage body according to an embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion (1015)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV light; Extreme ultraviolet lithography), X-rays, electron beams, and the like. In addition, in the present invention, light means actinic rays or radiation. In the present invention, unless otherwise specified, "exposure" includes not only exposure, far ultraviolet rays, X-rays, and EUV light, and the like, but also lithography by particle beams such as Electron beams or ion beams.

It is unclear what mechanism enables the chemical liquid according to an embodiment of the present invention to achieve the above object. According to the inventors of the present invention, presumably, the mechanism may be as below. The following mechanism is merely based on presumption, and in a case where the effects of the present invention are obtained by other mechanisms, they are also included in the scope of the present invention.

The chemical liquid contains a trace of impurities that are intermixed in the process of storage, transfer through pipe lines, or the like. These impurities tend to cause defects.

The chemical liquid according to the embodiment of the present invention contains the compound represented by General Formula (I), which will be described later, in an amount equal to or greater than a predetermined quantity. Therefore, the chemical liquid behaves as a saturated solution, and impurities (particularly, impurities that tend to cause defects) are hardly mixed into the chemical liquid.

In a case where the content of the compound represented by General Formula (I) is made equal to or smaller than a predetermined quantity, it is possible to prevent the compound represented by General Formula (I) from causing defects.

The chemical liquid according to the embodiment of the present invention contains an organic solvent that exhibits a predetermined conductivity and a compound that is represented by General Formula (I) which will be described later, in which the content of the compound represented by General Formula (I) with respect to the total mass of the chemical liquid is 0.10 mass ppt to 100,000 mass ppt.

Hereinafter, the components contained in the chemical liquid according to the embodiment of the present invention will be specifically described.

<Organic Solvent>

The chemical liquid according to the embodiment of the present invention contains an organic solvent that exhibits a predetermined conductivity.

The conductivity is equal to or lower than $10^{-6}$ S/m at 25° C. Particularly, in view of ESD (in view of avoiding the damage of a member or the ignition of a liquid that results from the occurrence of static electricity at the time of manufacturing), the conductivity is preferably equal to or lower than $5\times10^{-5}$ S/m, and more preferably equal to or lower than $10^{-5}$ S/m. The lower limit is not particularly limited, but is equal to or higher than $10^{-1}$ S/m in many cases.

The conductivity is measured at a liquid temperature of 25° C. by a method of using a conductivity detector SC4AJ (manufactured by Yokogawa Electric Corporation).

In the present specification, an organic solvent means a liquid organic compound contained in the chemical liquid at a content greater than 10,000 mass ppm per organic compound with respect to the total mass of the chemical liquid. That is, in the present specification, a liquid organic compound contained in the chemical liquid at a content greater than 10,000 mass ppm with respect to the total mass of the chemical liquid corresponds to an organic solvent.

Furthermore, in the present specification, "liquid" means that the component staying as a liquid in the atmosphere at 25° C.

The content of the organic solvent in the chemical liquid is not particularly limited, but is preferably equal to or greater than 98.0% by mass, more preferably greater than 99.0% by mass, even more preferably equal to or greater than 99.90% by mass, and particularly preferably greater than 99.95% by mass, with respect to the total mass of the chemical liquid. The upper limit thereof is less than 100% by mass.

One kind of organic solvent may be used singly, or two or more kinds of organic solvents may be used in combination. In a case where two or more kinds of organic solvents are used in combination, the total content thereof is preferably within the above range.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, those described in JP2016-057614A, JP2014-219664A, JP2016-138219A, and JP2015-135379A may be used.

The organic solvent is preferably at least one kind of compound selected from the group consisting of propylene glycol monomethyl ether, propylene glycol monoethyl ether (PGME), propylene glycol monopropyl ether, propylene glycol monomethyl ether acetate (PGMEA), ethyl lactate (EL), methyl methoxypropionate, cyclopentanone, cyclohexanone (CHN), γ-butyrolactone, diisoamyl ether, butyl acetate (nBA), isoamyl acetate, isopropanol, 4-methyl-2-pentanol, dimethyl sulfoxide, N-methyl-2-pyrrolidone, diethylene glycol, ethylene glycol, dipropylene glycol, propylene glycol, ethylene carbonate, propylene carbonate (PC), sulfolane, cycloheptanone, 1-hexanol, decane, and 2-heptanone. Among these, at least one kind of compound is more preferable which is selected from the group consisting of butyl acetate, isoamyl acetate, and 4-methyl-2-pentanol.

One kind of organic solvent may be used singly, or two or more kinds of organic solvents may be used in combination.

The type and the content of the organic solvent in the chemical liquid can be measured using a gas chromatography mass spectrometer.

<Compound Represented by General Formula (I)>

The chemical liquid according to the embodiment of the present invention contains a compound represented by General Formula (I).

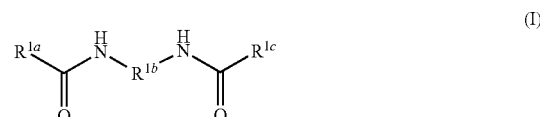

In General Formula (I), $R^{1a}$ and $R^{1c}$ each independently represent an alkyl group which may have a substituent.

The alkyl group may be linear or branched and may have a cyclic structure.

The number of carbon atoms in the alkyl group is preferably 1 to 50, and more preferably 1 to 20. The number of carbon atoms in the alkyl group does not include the number of carbon atoms in a substituent that the alkyl group may have.

$R^{1b}$ represents an alkylene group which may have a substituent. The number of carbon atoms in the alkylene group does not include the number of carbon atoms in a substituent that the alkylene group may have.

The alkylene group may be linear or branched and may have a cyclic structure.

The number of carbon atoms in the alkylene group is preferably 1 to 10, and more preferably 1 to 5.

Examples of the compound represented by General Formula (I) are as below.

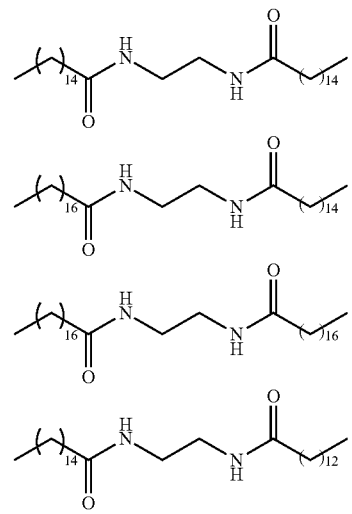

The boiling point of the compound represented by General Formula (I) is not particularly limited. The boiling point is preferably equal to or higher than 300° C. and more preferably equal to or higher than 400° C., because then the compound remains as a non-volatile compound and has a mechanism removed by the formation of a complex with metal components. The upper limit thereof is not particularly limited, but is preferably equal to or lower than 1,000° C.

The content of the compound represented by General Formula (I) with respect to the total mass of the chemical liquid is 0.10 mass ppt to 100,000 mass ppt. In view of further improving the effects of the present invention, the content of the compound represented by General Formula (I) with respect to the total mass of the chemical liquid is preferably 0.10 to 50,000 mass ppt, and more preferably 0.10 to 5,000 mass ppt.

One kind of compound represented by General Formula (I) may be used singly, or two or more kinds of compounds represented by General Formula (I) may be used. In view of further improving the effects of the present invention, it is particularly preferable to use two or more kinds of compounds represented by General Formula (I).

The chemical liquid may contain other components in addition to the aforementioned organic solvent and the compound represented by General Formula (I).

Hereinafter, those other components will be specifically described.

<Compounds Represented by General Formulae (II) to (IV)>

It is preferable that the chemical liquid according to the embodiment of the present invention contains at least one kind of organic compound selected from the group consisting of compounds represented by General Formula (II) to General Formula (IV).

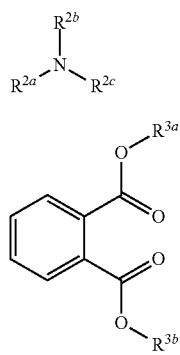

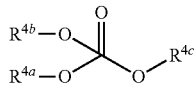

In General Formula (II), $R^{2a}$ represents an alkyl group which may have a substituent or a hydrogen atom.

$R^{2b}$ and $R^{2c}$ each independently represent a hydrogen atom, -AL-O—$R^{2d}$, —CO—$R^{2e}$, or —CH(OH)—$R^{2f}$.

AL represents an alkylene group which may have a substituent.

$R^{2d}$, $R^{2e}$, and $R^{2f}$ each independently represent a substituent.

In a case where there is a plurality of $R^{2d}$'s, the plurality of $R^{2d}$'s may be the same as or different from each other. In a case where there is a plurality of $R^{2e}$'s, the plurality of $R^{2e}$'s may be the same as or different from each other. In a case where there is a plurality of $R^{2f}$'s, the plurality of $R^{2f}$'s may be the same as or different from each other.

A combination of two groups selected from the group consisting of $R^{2a}$, $R^{2d}$, $R^{2e}$, and $R^{2f}$, two $R^{2d}$'s, two $R^{2e}$'s, or two $R^{2f}$'s may form a ring by being bonded to each other.

The group formed by the bonding of a combination of two groups selected from the group consisting of $R^2$, $R^{2d}$, $R^{2e}$, and $R^{2f}$, two $R^{2d}$'s, two $R^{2e}$'s, or two $R^{2f}$'s preferably contains one or more linking groups selected from the group consisting of —O—, —$NR^{2g}$— ($R^{2g}$ represents a substituent), and —NHCO—.

At least one of $R^{2a}$, $R^{2b}$, or $R^{2c}$ is not a hydrogen atom.

Examples of the compound represented by General Formula (II) are as below.

In the following examples, AL represents an alkylene group which has 1 to 10 carbon atoms and may have a substituent, and q represents an integer of 4 to 6.

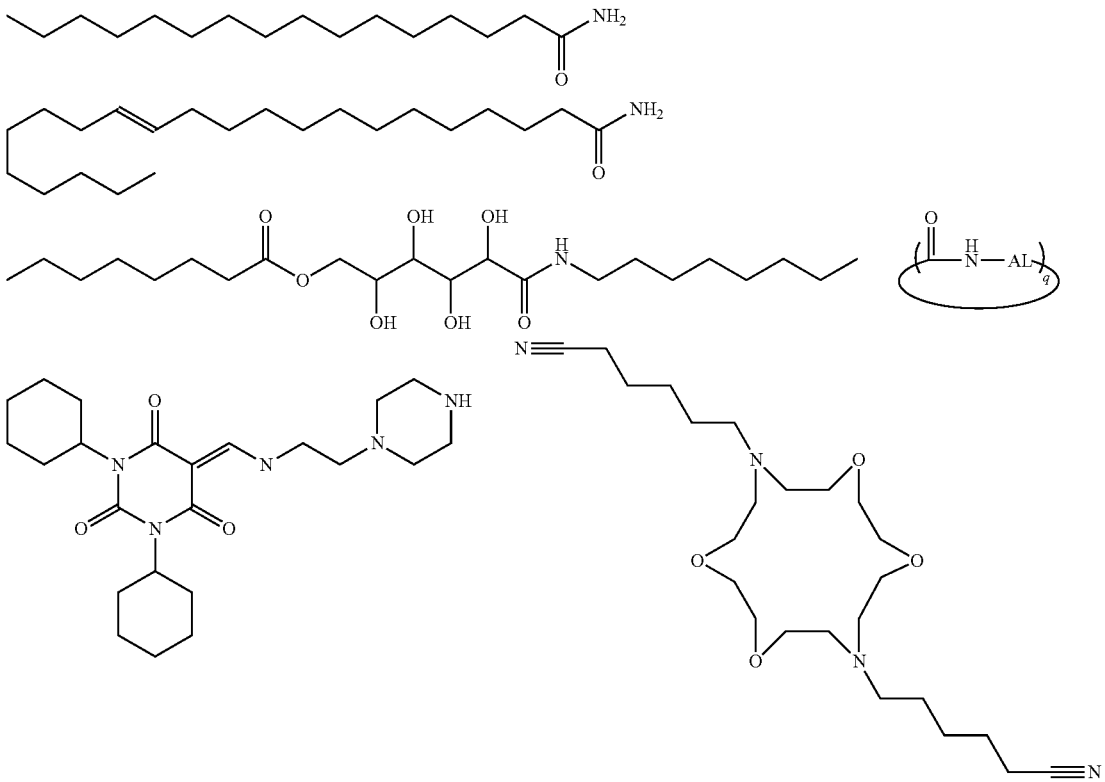

In General Formula (III), $R^{3a}$ and $R^{3b}$ each independently represent an alkyl group which may have a substituent.

The alkyl group may be linear or branched and may have a cyclic structure.

The number of carbon atoms in the alkyl group is preferably 1 to 20, and more preferably 2 to 10. The number of carbon atoms in the alkyl group does not include the number of carbon atoms in a substituent that the alkyl group may have.

As the substituent, for example, an aromatic ring group (may further have a substituent, preferably a phenyl group) is preferable.

Examples of the compound represented by General Formula (III) are as below.

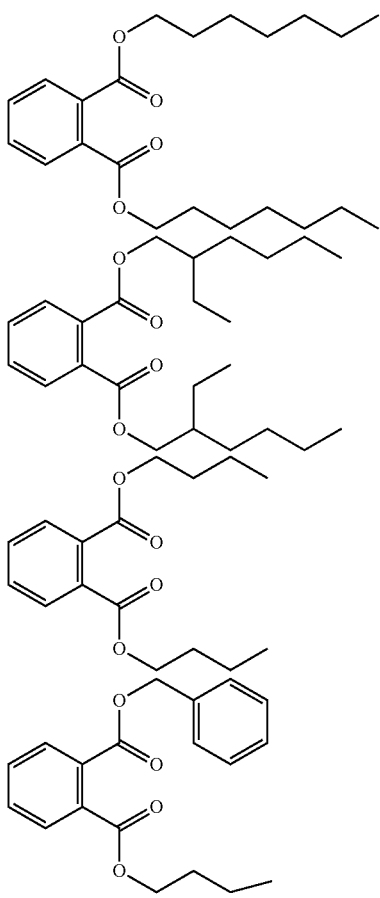

In General Formula (IV), $R^{4a}$ to $R^{4c}$ each independently represent a hydrogen atom, an alkyl group which may have a substituent, or a benzene ring group which may have a substituent.

One or more (preferably two or more) groups among $R^{4a}$ to $R^{4c}$ are preferably an alkyl group which may have a substituent or a benzene ring group which may have a substituent.

The alkyl group may be linear or branched and may have a cyclic structure.

The number of carbon atoms in the alkyl group is preferably 1 to 20, and more preferably 1 to 5. The number of carbon atoms in the alkyl group does not include the number of carbon atoms in a substituent that the alkyl group may have. As the substituent, an alkoxy group (preferably having 2 to 6 carbon atoms) or a halogen atom (a fluorine atom, a chlorine atom, a bromine atom, an iodine atom, or the like) is preferable.

As the substituent that the benzene ring group may have, an alkyl group (preferably having 2 to 10 carbon atoms) is preferable.

Examples of the compound represented by General Formula (IV) are as below.

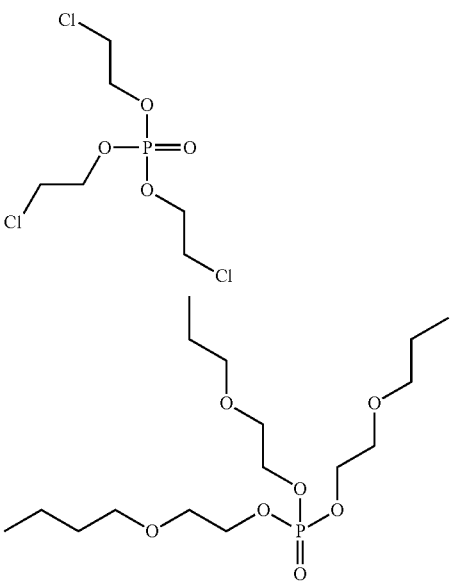

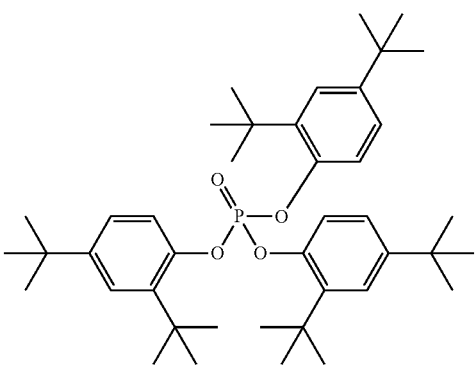

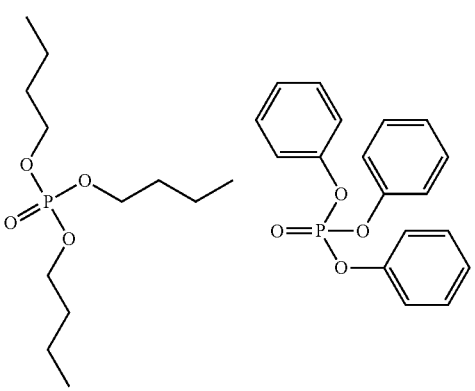

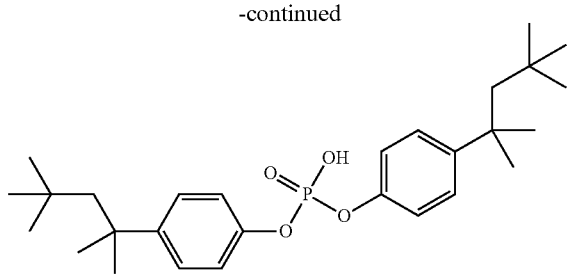

The content of the organic compound is not particularly limited. However, in view of further improving the effects of the present invention, the content of the organic compound with respect to the total mass of the chemical liquid is preferably 0.01 to 50,000 mass ppt, and more preferably 0.1 to 30,000 mass ppt.

One kind of organic compound may be used singly, or two or more kinds of organic compounds may be used. Particularly, in view of further improving the effects of the present invention, it is preferable to use two or more kinds of organic compounds.

<Metal Components>

The chemical liquid may contain metal components.

In the present invention, examples of the metal components include metal particles and metal ions. For example, the content of metal components means the total content of metal particles and metal ions.

The chemical liquid may contain either or both of metal particles and metal ions. It is preferable that the chemical liquid contains both the metal particles and metal ions.

Examples of metal elements in the metal particles include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), and Zr (zirconium). The metal components may contain one kind of metal element or two or more kinds of metal elements.

The metal particles may be simple particles or an alloy or may be in the form of aggregates of a metal and an organic substance.

The metal components may be metal components that are inevitably incorporated into components (raw materials) that are contained in the chemical liquid or metal components that are inevitably incorporated at the time of manufacturing, storage, and/or transfer of a treatment liquid. The metal components may be intentionally added.

In view of further improving the defect inhibition performance of the chemical liquid, in a case where the chemical liquid contains the metal components, the content of the metal components with respect to the total mass of the chemical liquid is preferably 0.01 to 500 mass ppt, more preferably 0.01 to 250 mass ppt, and even more preferably 0.01 to 100 mass ppt.

In a case where the content of the metal components is equal to or greater than 0.01 mass ppt, the metal components are easily removed by forming a complex with residual organic components, and the defect inhibition performance can be further improved.

In a case where the content of the metal components is equal to or smaller than 500 mass ppt, it is easy to avoid the increase of the occurrence of defects derived from the metal components.

In view of further improving the defect inhibition performance of the chemical liquid, in a case where the chemical liquid contains metal ions, the content of the metal ions with respect to the total mass of the chemical liquid is preferably 0.01 to 400 mass ppt, more preferably 0.01 to 200 mass ppt, and even more preferably 0.01 to 80 mass ppt.

In view of further improving the defect inhibition performance of the chemical liquid, in a case where the chemical liquid contains the metal particles, the content of the metal particles with respect to the total mass of the chemical liquid is preferably 0.01 to 400 mass ppt, more preferably 0.01 to 150 mass ppt, and even more preferably 0.01 to 40 mass ppt.

The type and the content of specific metal ions and specific metal particles in the chemical liquid can be measured by Single Nano Particle Inductively Coupled Plasma Mass Spectrometry (SP-ICP-MS).

The device used in SP-ICP-MS is the same as the device used in general inductively coupled mass spectrometry (ICP-MS). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present. Accordingly, the total mass of the metal particles and the metal ions as a measurement target is quantified as the content of metal components.

With SP-ICP-MS, the content of the metal particles can be measured. Accordingly, by subtracting the content of the metal particles from the content of the metal components in a sample, the content of the metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. This device can measure the content of metal components by the method described in Examples. Examples of the device other than the above include NexION350S manufactured by PerkinElmer Inc., Agilent 8900 manufactured by Agilent Technologies, Inc., and the like.

The ratio of the total content of the compounds represented by General Formula (I) to General Formula (IV) to the content of the metal components is not particularly limited, but is preferably 0.00001 to 10, and more preferably 0.00005 to 3.

<Water>

The chemical liquid may contain water.

As water, for example, distilled water, deionized water, pure water, and the like can be used without particular limitation.

Water may be added to the chemical liquid or unintentionally mixed into the chemical liquid in the process of manufacturing the chemical liquid. Examples of the case where water is unintentionally intermixed in the process of manufacturing the chemical liquid include a case where raw materials (for example, an organic solvent) used for manufacturing the chemical liquid contain water, a case where water is intermixed in the process of manufacturing the chemical liquid (for example, contamination), and the like. However, the present invention is not limited thereto.

The content of water in the chemical liquid is not particularly limited. The content of water with respect to the total mass of the chemical liquid is preferably 0.05% to 2.0% by mass. The content of water in the chemical liquid means a moisture content measured using a device which adopts Karl Fischer titration as a principle of measurement.

[Use of Chemical Liquid]

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like. For example, the chemical liquid can also be used for rinsing of the edge line of semiconductor substrates before and after the coating with resist.

Furthermore, the chemical liquid can also be used as a diluent of a resin contained in a resist solution. In addition, the chemical liquid may be diluted with another organic solvent and/or water, and the like.

The chemical liquid can also be suitably used for other uses in addition to the manufacturing of semiconductors. The chemical liquid can be used as a developer, a rinsing solution, and the like of polyimide, a resist for sensor, a resist for lens, and the like.

In addition, the chemical liquid can also be used as a solvent for medical uses or for washing. Particularly, the chemical liquid can be suitably used for washing containers, piping, substrates (for example, a wafer and glass), and the like.

Particularly, the chemical liquid according to the above embodiment is more preferably used for pre-wetting. That is, it is preferable that the chemical liquid according to the above embodiment is used as a prewet solution.

<Chemical Liquid Storage Body>

The chemical liquid storage body according to an embodiment of the present invention has a container and the aforementioned chemical liquid stored in the container.

In the present specification, the surface of the container means the interface between the container and another phase (typically, a gas and/or a liquid).

FIG. 1 is a partial cross-sectional view showing an example of a container with a lid included in the chemical liquid storage body according to the above embodiment.

A container 10 with a lid has a container 11 and a lid 12 put on the container 11. By a male screw not shown in the drawing that is provided on the outside of a mouth 13 of the container and a female screw not shown in the drawing that is disposed on the inside of a lateral portion 14 of the lid 12, the container 11 and the lid 12 can be fitted with each other. By the container 11 and the lid 12 fitted with each other, a cavity L is formed in the interior of the container 10 with a lid, and a liquid (for example, a chemical liquid containing an organic solvent and particularly preferably a chemical liquid for manufacturing semiconductors) can be stored in the cavity L.

The container 10 with a lid has the container 11 and the lid 12. However, the chemical liquid storage body according to the embodiment of the present invention is not limited thereto, and may have only the container.

The container 10 with a lid is formed of a composition. It is preferable that an inner wall surface 15 of the container 11 that is a liquid contact portion of the container 10 and an inner wall surface 15 of the lid 12 satisfy a condition A which will be described later.

In the container with a lid, it is preferable that at least a portion of the inner wall surface of the container 10 satisfies the condition A, and the inner wall surface 15 of the lid 12 may not satisfy the condition A.

Furthermore, in the container 10, it is preferable that the inner wall surface 15 satisfies the condition A, and it is more preferable that the inner wall surface 15 and an outer wall surface 16 satisfy the condition A.

Figure 2:
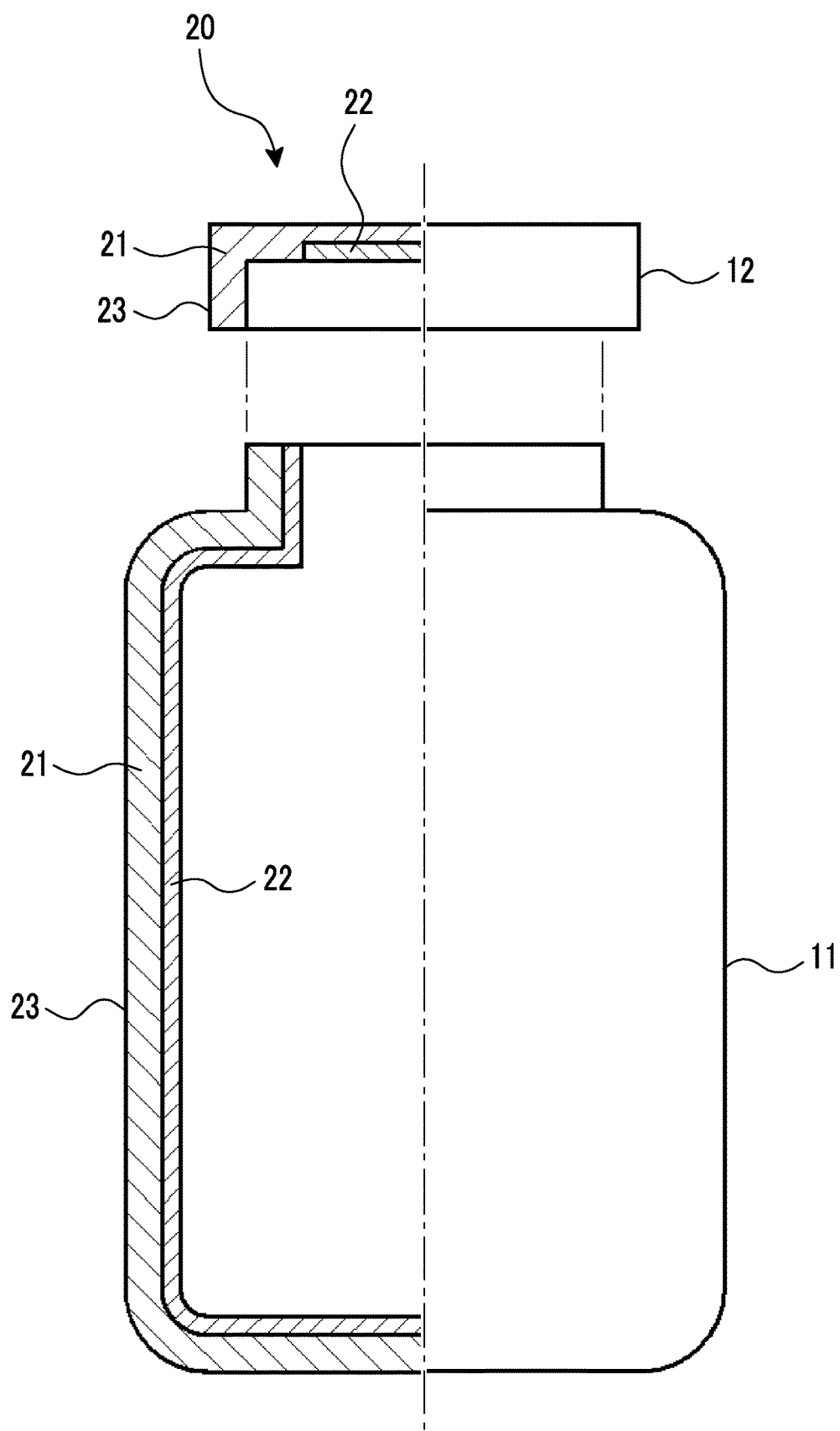
FIG. 2 is a partial cross-sectional view showing a modification example of the container with a lid included in the chemical liquid storage body according to the embodiment of the present invention.

FIG. 2 is a partial cross-sectional view showing a modification example of the container with a lid included in the chemical liquid storage body according to the embodiment of the present invention. Just as the container 10 with a lid, the container 20 with a lid also has the container 11 and the lid 12, a cavity is formed in the interior of the container 20 by fitting the container 11 and the lid 12 with each other, and a chemical liquid can be stored in the cavity.

In the container 20 with a lid, each of the container 11 and the lid 12 has a base material 21 and a coating layer 22 formed on the base material 21. The liquid contact portion of the container 20 has the coating layer 22. It is preferable that the condition A is satisfied in the surface of the coating layer 22. In a case where the condition A is satisfied, even though the chemical liquid is stored in the container and preserved, the defect inhibition performance of the chemical liquid does not deteriorate over time.

The liquid contact portion of the container 20 with a lid has the coating layer 22. However, the container included in the chemical liquid storage body according to the embodiment of the present invention is not limited thereto, and an outer surface 23 of the container 11 and the lid 12 may also have the coating layer.

Furthermore, the chemical liquid storage body according to the embodiment of the present invention is not limited to be above, and may have only the container.

<Container>

It is preferable that the container contains a polymer. That is, the container is preferably formed of a composition containing a polymer.

For example, in the case of the aspect shown in FIG. 1, it is preferable that the container is formed of a polymer. Furthermore, the container may be constituted with a composition containing a polymer.

As in the aspect shown in FIG. 2, an aspect may be adopted in which the container has a base material and a coating layer disposed on the base material, and the coating layer contains a polymer. The thickness of the coating layer is not particularly limited, but is preferably 0.01 to 1 μm in general.

The base material may be appropriately selected according to the use, and may be an organic material or an inorganic material. As the organic material, a resin which will be described later is preferable. As the inorganic material, glass and a metal (stainless steel, an anticorrosive nickel alloy, and the like) are preferable.

The shape of the base material is not particularly limited, and can be appropriately selected according to the use.

(Polymer)

As the polymer, known polymers can be used without particular limitation. Particularly, in view of further improving the defect inhibition performance that the chemical liquid exhibits after being stored in the container, as the polymer, polyolefin (for example, polyethylene or polypropylene) or a polymer containing fluorine atoms (hereinafter, referred to as "fluorine-containing polymer" as well) is preferable. Although there is no particular limitation, as the polyolefin, polyethylene is preferable.

The fluorine-containing polymer is not particularly limited. However, in view of further improving the defect inhibition performance that the chemical liquid exhibits after being stored in the container, at least one kind of compound is more preferable which is selected from the group consisting of polytetrafluoroethylene, perfluoroalkoxyalkane, a tetrafluoroethylene*hexafluoropropylene copolymer, an ethylene*tetrafluoroethylene copolymer, an ethylene* chlorotrifluoroethylene copolymer, polychlorotrifluoroethylene, polyvinylidene fluoride, and polyvinyl fluoride, and polytetrafluoroethylene is even more preferable.

Generally, groups such as —$CH_2OH$ and —COOH derived from a polymerizable group and/or a molecular weight adjuster remain on the terminal of a polymer chain of the fluorine-containing polymer in many cases. These groups are unstable and generate —COF by being thermally decomposed at the time of molding. Furthermore, the inventors of the present invention know that —COF undergoes hydrolysis and causes the elution of fluoride ions and the like into a chemical liquid.

The aforementioned fluorine-containing polymer is preferably a fluorine-containing polymer having a perfluoroalkyl group on the terminal thereof. In other words, it is preferable that the fluorine-containing polymer is a treated fluorine-containing polymer (having undergone terminal stabilization) in which the terminal of a polymer chain is substituted with a perfluoroalkyl group. The perfluoroalkyl group is not particularly limited but is preferably —$CF_2$—$CF_3$ or —$CF_3$.

As the method for substituting the terminal of a polymer chain, known methods can be used without particular limitation. For example, it is possible to adopt known methods described in JP1985-240713A (JP-S60-240713A), JP1987-104822A (JP-S62-104822A), JP1991-250008A (JP-H03-250008A), and the like.

The total content (number) of —$CH_2OH$, —COOH, and —COF in the treated fluorine-containing polymer per $10^6$ carbon atoms in the treated fluorine-containing polymer is preferably equal to or smaller than 50, and more preferably equal to or smaller than 30.

In a case where the container is formed of a composition containing a polymer, the content of the polymer with respect to the total mass of the composition is not particularly limited. Generally, the content of the polymer with respect to the total mass of the composition is preferably equal to or greater than 80% by mass, and more preferably equal to or greater than 95% by mass. Furthermore, the content of the polymer with respect to the total mass of the composition is preferably equal to or smaller than 99.9% by mass. One kind of polymer may be used singly, or two or more kinds of polymers may be used in combination.

In a case where two or more kinds of polymers are used in combination, the total content thereof is preferably within the above range.

In a case where the container is formed of the composition, the total mass of the composition equals the total mass of the container. In a case where the container has a base material and a coating layer formed on the base material, and the coating layer is formed of the composition, the total mass of the composition equals the total mass of the coating layer.

In a case where the container contains a fluorine-containing polymer, an atom number ratio of $X_1$, which is measured by time-of-flight secondary ion mass spectrometry, of the number of fluorine atoms contained in at least a surface of a portion of the container to the number of carbon atoms contained in the surface is not particularly limited. $X_1$ is preferably equal to or higher than 0.01, more preferably equal to or higher than 0.30, even more preferably equal to or higher than 0.35, and particularly preferably equal to or higher than 0.50. Furthermore, $X_1$ is preferably equal to or lower than 3.0, and more preferably equal to or lower than 2.0. In a case where $X_1$ is equal to or higher than 0.3 (preferably equal to or higher than 0.5), it is easy to improve the chemical resistance of the surface of the container, and even though a chemical liquid is stored in the container, impurities are hardly eluted into the stored chemical liquid. In a case where $X_1$ is equal to or lower than 3.0, free fluorine atoms in the surface of the container are further reduced, and impurities containing fluorine (for example, fluoride ions and the like) are hardly eluted into the stored chemical liquid. The method for measuring $X_1$ by time-of-flight secondary ion mass spectrometry is as described in Examples.

$X_1$ satisfies the above range preferably in at least a surface of a portion of the container, more preferably in a surface of a portion of the liquid contact portion of the container, more preferably in at least 10 spots measured in the surface of the liquid contact portion of the container, even more preferably in the entire surface of the liquid contact portion of the container, and particularly preferably in the entire surface of the container.

There is no particular limitation on an atom number ratio $X_2$, which is measured using time-of-flight secondary ion mass spectrometry, of the number of fluorine atoms contained in a position 10 nm below the aforementioned surface in a thickness direction of the container to the number of carbon atoms contained in the position. However, $X_2$ is preferably 0.5 to 2.5, more preferably 1.0 to 2.0, and even more preferably 1.5 to 2.0.

Furthermore, there is no particular limitation on an atom number ratio $X_2$, which is measured using an X-ray photoelectron spectrometer, of the number of fluorine atoms contained in a position 10 nm below the aforementioned surface in a thickness direction of the container to the number of carbon atoms contained in the position. However, $X_2$ is preferably 0.5 to 2.5, more preferably 1.0 to 2.0, and even more preferably 1.5 to 2.0. The method for analyzing $X_2$ (that is, in the thickness direction) by using time-of-flight secondary ion mass spectrometry is as described in Examples.

In a case where the container (or the composition) contains a fluorine-containing polymer, in view of further improving the defect inhibition performance that the chemical exhibits after being stored in the container, it is preferable that the $X_1$ and $X_2$ satisfy $X_1 > X_2$.

In this case, $X_1 > X_2$ may be satisfied in at least a surface of a portion of the content and in a corresponding position 10 nm below the surface in a thickness direction. It is more preferable that the above relationship is satisfied in the liquid contact portion.

In view of further improving the defect inhibition performance that the chemical liquid exhibits after being stored in the container, the container preferably contains a fluorine-containing polymer; an atom number ratio $X_1$, which is measured by time-of-flight secondary ion mass spectrometry, of the number of fluorine atoms contained in at least a surface of a portion (preferably the entirety) of the container to the number of carbon atoms contained in the surface is 0.30 to 3.0 (more preferably 0.50 to 3.0); and provided that an integrated intensity of a peak, which is determined using a scattering-type near field microscope at a position 10 nm below the surface in the thickness direction of the container, resulting from C=C stretching vibration confirmed in a range of 1,500 to 1,800 $cm^{-1}$ is $I_3$, and an integrated intensity of a peak, which is determined using the same microscope at the same position, resulting from C—H stretching vibration confirmed in a range of 2,800 to 3,500 $cm^{-1}$ is $I_4$, $M_2$ represented by Formula (1): $M_2 = I_3(I_3 + I_4)$ preferably satisfies $M_1 < M_2$. Each of the peaks measured within the surface by using the scattering-type near field microscope is a value reflecting how each component in the container is distributed in a region ranging from the surface of the container to a position approximately 100 nm below the surface in a thickness direction of the container. The measurement method performed using the scattering-type near field microscope is as described in Examples.

The container may be formed of a composition containing a polymer and a nanocarbon material which will be described later. At this time, it is preferable that at least a surface of a portion (preferably the entirety) of the container satisfies the following condition A.

Condition A: provided that an integrated intensity of a peak, which is determined by atomic force microscopy infrared spectroscopy, resulting from C=C stretching vibration confirmed in a range of 1,500 to 1,800 cm$^{-1}$ is $I_1$, and an integrated intensity of a peak, which is determined by atomic force microscopy infrared spectroscopy, resulting from C—H stretching vibration confirmed within a range of 2,800 to 3,500 cm$^{-1}$ is $I_2$, $M_1$ represented by Formula (1): $M_1=I_1/(I_1+I_2)$ is 0.05 to 0.5.

The condition A is satisfied preferably in at least a surface of a portion of the container, more preferably in a portion of the liquid contact portion (preferably a region that the stored chemical liquid contacts or is likely to contact) of the container, more preferably at any 10 or more spots measured within the surface of the container, particularly preferably in the entirety of the liquid contact portion of the container, and most preferably in the entire surface of the container.

The above relationship is satisfied in at least a surface of a portion of the container. Presumably, as a result, the nanocarbon material may be hardly eluted into the stored chemical liquid, and a pathway for the highly conductive nanocarbon material may be formed in a region far below the surface. It is considered that for this reason, the entire container may be hardly charged, and the elution of impurities may be inhibited.

The chemical liquid is stored in the container. Therefore, within the surface of the container, it is preferable that the surface contacting the liquid (liquid contact portion) satisfies the condition A which will be described later. The condition A, which will be described later, is satisfied preferably in at least a surface of a portion of the container, and more preferably the entire surface of the container. Each of the aforementioned peaks, which are determined by atomic force microscopy infrared spectroscopy (AFM-IR), is a value reflecting how each component in the container is distributed in a region ranging from the surface of the container to a position approximately 50 nm below the surface in a thickness direction of the container. Accordingly, compared to the measurement results obtained using a scattering-type near field microscope which will be described later, the peaks reflect the distribution of the nanocarbon material in a portion closer to the surface. The measurement method performed using the atomic force microscopy infrared spectroscopy is as described in Examples.

(Nanocarbon Material)

The container (of the composition) may contain a nanocarbon material.

The content of the nanocarbon material with respect to the total mass of the composition is not particularly limited. Generally, the content of the nanocarbon material with respect to the total mass of the composition is preferably equal to or greater than 0.001% by mass, and more preferably equal to or greater than 0.005% by mass. Furthermore, the content of the nanocarbon material with respect to the total mass of the composition is preferably equal to or smaller than 3% by mass, more preferably equal to or smaller than 0.5% by mass, and even more preferably equal to or smaller than 0.4% by mass. One kind of nanocarbon material may be used singly, or two or more kinds of nanocarbon materials may be used in combination. In a case where two or more kinds of nanocarbon materials are used in combination, the total content thereof is preferably within the above range.

In a case where the content of the nanocarbon material is 0.001% to 0.5% by mass, the defect inhibition performance that the container exhibits after being stored in the container is further improved. In a case where the content of the nanocarbon material is equal to or greater than 0.005% by mass, the chemical liquid storage body has further improved antistatic performance. In a case where the content of the nanocarbon material is equal to or smaller than 0.4% by mass, the stored chemical liquid maintains the defect inhibition performance for a longer period of time.

In the present specification, the nanocarbon material means a carbon material having a nanoscale (0.1 to 1,000 nm) structure (a particle-like structure, a sheet-like structure, a layer-like structure, a needle-like structure, a rod-like structure, a fibrous structure, or a cylindrical structure) in at least a portion thereof.

Examples of the nanocarbon material include fullerene, graphene, carbon nanoballs (carbon black), carbon nanohorns, carbon nanofiber, carbon nanotubes, and the like.

Examples of the nanocarbon material include those described in "Chemical Industry", Vol. 56, p 50-62 (2005), Langmuir, Vol. 11, p 3682-3866 (1995), and the like.

Particularly, in view of further improving the defect inhibition performance that the chemical liquid exhibits after being stored in the container, as the nanocarbon material, at least one kind of material is preferable which is selected from the group consisting of fullerene, graphene, carbon nanoballs (carbon black), carbon nanohorns, carbon nanofiber, and carbon nanotubes, at least one kind of material selected from the group consisting of carbon nanofiber and carbon nanotubes is more preferable, and carbon nanotubes are particularly preferable.

It is desirable that the nanocarbon material has high purity. In a case where the nanocarbon material contains impurities such as metals and has a carbon purity equal to or higher than 90%, impurities are hardly aggregated in the manufacturing process, and the obtained container hardly becomes brittle. In the present specification, carbon purity means a numerical value determined from the result of elementary analysis performed using fluorescent X-rays.

Carbon Nanotubes

As the carbon nanotubes, any of single-walled carbon nanotubes (SWNT: single-walled nanotubes) and multi-walled carbon nanotubes (MWNT: multi-walled nanotubes) can be used as appropriate. As the carbon nanotubes, single-walled carbon nanotubes are more preferable because these can form a container having higher electric conductivity.

The major axis of the carbon nanotubes is not particularly limited, but is preferably 0.005 to 1,500 µm, more preferably 0.01 to 1,000 µm, and even more preferably 60 to 1,000 µm.

In a case where the major axis of the carbon nanotubes is equal to or longer than 0.01 µm, the carbon nanotubes easily form a network (reticular structure) in the composition.

Furthermore, the formed network easily follows the deformation of the composition and is hardly broken.

In a case where the major axis of the carbon nanotubes is equal to or shorter than 1,000 µm, at the time of mixing the carbon nanotubes with a polymer, the carbon nanotubes are easily dispersed in the polymer.

Particularly, in view of further improving the defect inhibition performance that the chemical liquid exhibits after being stored in the container, the major axis of the carbon nanotubes is preferably less than 1,000 µm, more preferably equal to or shorter than 800 µm, even more preferably equal to or shorter than 300 µm, and particularly preferably less than 300 µm.

In the present specification, the major axis of carbon nanotubes means the length of a bundle that is determined by dispersing carbon nanotubes in N-methylpyrrolidone, adding the dispersion dropwise to a substrate, and observing the major axis using a scanning-type atomic force microscope.

(Other Components)

The container may contain other components in addition to the polymer and the nanocarbon material. Examples of those other components include a surfactant. As the surfactant, known surfactants can be used without particular limitation. In the present specification, as the surfactant, it is possible to use an ionic surfactant (an anionic surfactant, a cationic surfactant, or an amphoteric surfactant); a nonionic surfactant, and the like. Furthermore, it is possible to use a surfactant having at least one or more fluorine atoms in the structure thereof. Examples of the anionic surfactant include a sulfuric acid-type surfactant, a phosphoric acid ester-type surfactant, a sulfonic acid-type surfactant, and the like. Examples of the cationic surfactant include a quaternary ammonium salt-type surfactant and the like. Examples of the amphoteric surfactant include an alkyl betaine-type surfactant, an amide betaine-type surfactant, an amine oxide-type surfactant, and the like. Examples of the nonionic surfactant include a fatty acid ester-based surfactant, a sorbitan fatty acid ester-based surfactant, a sorbitan ester ether-based surfactant, a polyether-based surfactant, an alkylphenol-based surfactant, a polyester-based surfactant, a sorbitan ester ether-based surfactant, an alkylamine-based surfactant, and the like. As the nonionic surfactant, in view of further improving the defect inhibition performance that the chemical liquid exhibits after being stored in the container, a polyether-based surfactant is preferable. Examples of the polyether-based surfactant include polyethylene glycol, polypropylene glycol, polytetramethylene glycol, polyoxyethylene oleyl ether, polyoxyethylene stearyl ether, polyoxyethylene lauryl ether, polyoxyethylene dodecyl ether, polyoxyethylene nonyl phenyl ether, polyoxyethylene octyl phenyl ether, a polyoxyethylene•polyoxypropylene block copolymer, and the like. Among these, polyethylene glycol is particularly preferable. One kind of surfactant may be used singly, or two or more kinds of surfactants may be used in combination.

In a case where a fluorine-containing polymer is used as a polymer, due to the necessity of the surfactant in a process of synthesizing the fluorine-containing polymer or for the purpose of improving molding properties of the fluorine-containing polymer, the surfactant is mixed in, and as a result, sometimes the surfactant is also contained in the composition. Although the fluorine-containing polymer has excellent heat resistance, it is difficult to perform melting molding on the fluorine-containing polymer in many cases. In these cases, for example, the fluorine-containing polymer, the nanocarbon material, and the surfactant are dispersed in a solvent such as water and/or an organic solvent so as to obtain a dispersion liquid, and a base material is coated with the dispersion liquid, thereby obtaining a coating layer formed of a composition containing a fluorine-containing polymer, a nanocarbon material, and a surfactant. Alternatively, shearing force is applied to the dispersion liquid such that the fluorine-containing polymer particles are aggregated, the aggregated particles are dried so as to obtain powder, and the powder is made into paste and subjected to extrusion molding, thereby obtaining a container formed of a composition containing a fluorine-containing polymer, a nanocarbon material, and a surfactant. As the surfactant described above, a surfactant having at least one or more fluorine atoms in the structure thereof is preferable.

The content of the surfactant in the composition is not particularly limited. Generally, the content of the surfactant with respect to the total mass of the composition is preferably 0.001% to 10% by mass, and more preferably 0.005% to 5.0% by mass. One kind of surfactant may be used singly, or two or more kinds of surfactants may be used in combination. In a case where two or more kinds of surfactants are used in combination, the total content thereof is preferably within the above range.

In the present specification, the content of the surfactant in the composition can be obtained by being calculated from the proportion of the surfactant added at the time of preparing the composition or by being measured under the following conditions by using a high-performance liquid chromatography mass spectrometer (LC/MS).

<Extraction of Surfactant from Composition>

First, the composition is immersed in a molten alkali metal salt (for the container formed of the composition, a portion of the container is immersed in the molten alkali metal salt). Then, the molten alkali metal salt is dissolved in water, an alcohol, or a ketone-based organic solvent such that the surfactant is extracted from the composition.

<Analysis Conditions for Extracted Surfactant>

The surfactant is analyzed by the following method. The measurement conditions of LC/MS are as below.

If necessary, the extract is used after being concentrated (for example, the extract is used after being 1,000× concentrated).

The content of the surfactant can be measured using a liquid chromatography mass spectrometer (trade name: "UPLC-H-Class, Xevo G2-XS QTof", manufactured by Thermo Fisher Scientific, the measurement conditions are as below) as a device.

From the obtained measurement results, organic impurities as components having m/z of 300 to 1,000 whose attribution is unclear are classified from organic impurities, and the content (relative quantity) is determined as well.

(Measurement Conditions)

LC Conditions

Device: UPLC H-Class

Column: ACQUITY UPLC C8 1.7 um, 2.1×100 mm

Column temperature: 40° C.

Mobile phase: A: 0.1% formic acid, B: MeOH containing 0.1% formic acid

Flow rate: 0.5 mL/min

Injection amount: 2 µL

MS Conditions

Device: Xevo G2-XS Q-Tof

Mode of ionization: ESI positive/negative

Capillary voltage: 1.0 kV/2.5 kV

Desolvation gas: 1,000 L/hr, 500° C.

Cone gas: 50 L/hr

Cone voltage: 40 V (offset 80 V)

Collision energy: 2 eV

Measurement range: m/z 100-1,000

Measurement mode: MS Sensitivity Mode (resolution/30,000)

MS/MS Conditions

Collision energy

Low Energy: 6 eV

High Energy: 30 eV to 50 eV (ramp start to end)

Provided that a mass-based content of the surfactant in at least a surface of a portion (preferably the entirety) of the container (in a case where the container has a coating layer, at least a surface of a portion (preferably the entirety) of the coating layer) is $A_1$, and a mass-based content of the surfactant in a position 10 nm below the surface in a thickness direction of the container is $A_2$, $A_1/A_2$ is not particularly limited, but is preferably 0.01 to 20 and more preferably 0.10 to 10.

In a case where $A_1/A_2$ is equal to or higher than 0.10, the localization of the surfactant within the surface layer is inhibited, the surfactant is hardly eluted as impurities, and consequently, the defect inhibition performance of the chemical liquid is maintained. In a case where $A_1/A_2$ is equal to or lower than 10, the localization of an excess of surfactant within the surface is inhibited, and even though the surfactant is eluted as impurities, the amount of impurities falls into an allowable range. Consequently, the defect inhibition performance of the chemical liquid is maintained.

In this case, $A_1/A_2$ may be in a predetermined range in at least a surface of a portion of the container and in a corresponding position 10 nm below the surface in the thickness direction. The above relationship is satisfied preferably in a portion of a surface of the liquid contact portion of the container, even more preferably in the entire surface of the liquid contact portion of the container, and particularly preferably in the entire surface of the container.

In the present specification, $A_1/A_2$ means a numerical value that can be measured by the following method by using time-of-flight secondary ion mass spectrometry (TOF-SIMS).

The conditions for measurement performed using a time-of-flight secondary ion mass spectrometer (TOF-SIMS) (manufactured by ION-TOF GmbH, trade name: "TOF-SIMS5") will be shown below.

Primary ion: $Bi_3^{2+}$
Primary ion accelerating voltage: 25 kV
Measurement area: 500 µm×500 µm
Measurement temperature: equal to or lower than −100° C.

For performing analysis in the thickness direction, a sample is irradiated with Ar gas cluster ion beams (Ar-GCIB) for etching and with $Bi^{3+}$ as a primary ion source, and the obtained secondary ions are analyzed using a time-of-flight mass spectrometer, thereby obtaining a spectrum.

In a case where etching was performed using Ar-GCIB, the molecular structure is not destroyed in the thickness direction from the outermost surface. Accordingly, regarding the state of interfacial bonding, accurate information can obtained. Because the value obtained by the measurement was expressed using atom/cm$^2$, the number of moles was calculated from the numerical value and multiplied by the number of atoms (number of molecules) so as to convert the value into mass. The beam irradiation conditions are as below.

Ar-GCIB injection pressure: 3 MPa
Measurement area: 150 µm×150 µm
Angle measurement mode: high-resolution mass spectrometry In at least a surface of a portion (preferably the entirety) of the container (in a case where the container has a coating layer, in at least a surface of a portion (preferably the entirety) of the coating layer), a ratio of $M_2$ to $A_2$ described above ($M_2/A_2$) is not particularly limited. However, in view of obtaining a chemical liquid storage body having further improved effects of the present invention, $M_2/A_2$ is preferably equal to or higher than 1, more preferably equal to or higher than 10, even more preferably equal to or higher than 50, and particularly preferably equal to or higher than 100. Furthermore, $M_2/A_2$ is preferably equal to or lower than 1,000,000, more preferably equal to or lower than 100,000, even more preferably equal to or lower than 10,000, particularly preferably equal to or lower than 5,000, and most preferably equal to or lower than 2,000.

Examples of the surfactant include compounds represented by Formulae (1) and (2).

   Formula (1)

   Formula (2)

In the formulae, M$^+$ represents a cation, A's in Formulae (1) and (2) are the same as each other. A represents Formula (A1).

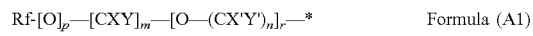   Formula (A1)

In the formula, * represents a binding position, Rf represents a fluorinated alkyl group which may have one or more oxygen atoms, p represents 1 or 0, m and n each independently represent an integer equal to or greater than 1, r represents 0 or an integer equal to or greater than 1, X, X', Y, and Y' each independently represent H, F, CF$_3$, or C$_2$F$_5$, a plurality of X's, X"s, Y's, and Y"s may be the same as or different from each other respectively, and X, X', Y, and Y' do not simultaneously represent H.

Alternatively, A represents Formula (A2).

   Formula (A2)

In the formula, * represents a binding position, X represents a hydrogen atom, a halogen atom, or an alkyl group, an alkenyl group, a cycloalkyl group, or an aryl group which may contain one or more fluorine atoms and one or more oxygen atoms, R represents a hydrogen atom or an alkyl group, an alkenyl group, a cycloalkyl group, or an aryl group which may contain a halogen atom except for a fluorine atom and one or more oxygen atoms, and t represents an integer equal to or greater than 1.

Rf is not particularly limited, and examples thereof include a perfluoroalkyl group, a perfluoroalkoxy group, a partially fluorinated alkyl group, a partially fluorinated alkoxy group which may be linear, cyclic, or branched, and the like. Each of these groups may contain an oxygen atom.

"Perfluoroalkyl group" and "perfluoroalkoxy group" refer to a group in which all the hydrogen atoms are substituted with fluorine atoms. "Partially fluorinated alkyl group" and "partially fluorinated alkoxy group" refer to a group in which some of the hydrogen atoms are substituted with fluorine atoms.

Rf may contain 1 to 14 carbon atoms. Rf is not particularly limited, and more specific examples thereof include F$_3$C—, F$_3$CO—, F$_3$CFHC—, F$_5$C$_2$—, F$_3$COF$_2$C—, F$_3$COF$_2$CO—, F$_7$C$_3$—, F$_9$C$_4$—, F$_{11}$C$_5$—, F$_2$HC—, and the like.

It is preferable that at least one of X or Y represents F, CF$_3$, or C$_2$F$_5$. It is more preferable that each of X and Y is selected from the group consisting of F, CF$_3$, and C$_2$F$_5$ (for example, both the X and Y represent F, alternatively, X represents F and Y represents CF$_3$).

X, X', Y, and Y' do not simultaneously represent H.

It is preferable that one group or two or more groups among X, X', Y, and Y' represent H.

It is preferable that at least one of X or Y does not represent H. It is more preferable that both the X and Y do not represent H. It is even more preferable that X and Y are selected such that X and Y represent F.

For example, the surfactant represented by Formula (1) and Formula (A1) includes perfluoroalcohol as an alcohol which does not contain a hydrogen atom except for the hydrogen atom in the*—$CH_2OH$ group. Alternatively, such an alcohol may be a partially fluorinated alcohol which preferably contains two or less hydrogen atoms or one or less hydrogen atom in addition to the hydrogen atom in the —$CH_2OH$ group.

In Formula (A2), X represents a hydrogen atom, a halogen atom, an alkyl group, an alkenyl group, a cycloalkyl group, or an aryl group. The alkyl group, the alkenyl group, the cycloalkyl group, and the aryl group represented by X may contain one or more fluorine atoms and one or more oxygen atoms.

R represents a hydrogen atom or an alkyl group, an alkenyl group, a cycloalkyl group, or an aryl group which may contain a halogen atom except for a fluorine atom and contain one or more oxygen atoms. t represents an integer equal to or greater than 1.

In an embodiment of the Formula (A2), X may be an atom such as a hydrogen atom or a halogen atom (for example, a fluorine atom, a chlorine atom, or a bromine atom).

In another embodiment, X may be an alkyl group, a cycloalkyl group, an aryl group, and the like, and the number of carbon atoms contained in these groups is preferably about 1 to 20. These groups may contain a fluorine atom or may be fluorinated to a high degree (that is, at least 80%, 90%, 95%, or 100% of hydrogen atoms bonded to carbon atoms are substituted with fluorine atoms). These groups may contain one or more oxygen atoms (that is, ether bonds). Furthermore, these groups may be linear or branched or saturated or unsaturated. As long as these functional groups are not unnecessarily oxidized and do not become a steric hindrance of an oxidation reaction, these groups may be substituted with other functional groups (for example, amine, sulfide, ester, and the like).

R may be a hydrogen atom or a halogen atom except for a fluorine atom. In another embodiment, examples of R include an alkyl group, an aryl group, an alkoxy group, an oxyalkyl group, a polyoxyalkyl group, a polyoxyalkoxy group which may be linear, cyclic, or branched, and the like.

Specifically, examples of R include $H_3C$—, $H_5C_6$—, and the like.

Specific examples of the surfactant represented by Formula (1) in which A is represented by Formula (A1) include: $CF_3CF_2$—O—$CF_2CF_2$—$OCF_2$—$CH_2OH$, $CHF_2(CF_2)_5$—$CH_2OH$, $CF_3(CF_2)_6$—$CH_2OH$, $CF_3(CF_2)_3(CH_2CF_2)_2$—$CF_2CF_2CF_2$—$CH_2OH$, $CF_3(CF_2)_2CH_2(CF_2)_2$—$CH_2OH$, $CF_3(CF_2)_2$—$CH_2OH$, $CF_3$—O—$(CF_2)_3$—$OCF(CF_3)$—$CH_2OH$, $CF_3CF_2CH_2$—O—$CF_2CH_2$—$OCF_2$—$CH_2OH$, $CF_3$—O—$(CF_2)_3$—$OCHFCF_2$—$CH_2OH$, $CF_3$—O—$(CF_2)_3$—$OCF_2$—$CH_2OH$, $CF_3(CF_2)_2$—O—$CF(CF_3)CF_2)$—$OCF(CF_3)$—$CH_2OH$, $CF_3(CF_2)_2$—O—$CF_2CF_2$—$(OCF_2CF_2)_3$—$OCF(CF_3)$—$CH_2OH$, $CF_3CF_2$—O—$CF_2CF_2$—(O—$CF_2CF_2)_2$—O—$CF_2$—$CH_2OH$, $R_f$—O—CHF—$CH_2OH$, $R_f$—O—$CHFCF_2$—$CH_2OH$, $R_f$—O—$CF_2CHF$—$CH_2OH$, $R_f$—O—$CF_2CHFCF_2$—$CH_2OH$, $R_f$—O—$CF_2CF_2$—$CH_2OH$, $R_f$—O—$CF_2CF_2CF_2$—$CH_2OH$, $R_f$—O—$CHFCF_2$—O—$CF_2$—$CH_2OH$, $R_f$—$CHFCF_2$—O—$CF_2$—$CH_2OH$, $R_f$—O—$(CF_2)_n$—$CH_2OH$, $R_f$—$(CF_2)_{n1}$—$CH_2OH$, $R_f$—O—$CF_2$—(O—$CF_2)_{n1-1}$—O—$(CF_2)_{m1}$—$CH_2OH$, $R_f$—O—$CF_2CF_2$—(O—$CF_2CF_2)_{n1}$—O—$(CF_2)_{m1}$—$CH_2OH$, $R_f$—O—$CF(CF_3)CF_2$—(O—$CF(CF_3)CF_2)_{n1-1}$—O—$(CF_2)_{m1}$—$CH_2OH$, and $R_f$—O—$CF_2CF(CF_3)$—(O—$CF_2CF(CF_3))_{n1-1}$—O—$(CF_2)_{m1}$—$CH_2OH$ ($R_f$ represents a partially fluorinated alkyl group or a perfluoroalkyl group which may contain one or more oxygen atoms and is linear or branched, n1 represents 1 to 10, and m1 represents 1 to 10).

Examples of the fluorine-containing surfactant represented by Formula (1) in which A is represented by Formula (A2) include $C_6H_5$—CHF—$CH_2OH$, $CH_3$—CHF—$CH_2OH$, and the like.

The surfactant represented by Formula (1) can be converted into the corresponding compound represented by Formula (2) (carboxylic acid or a salt thereof) by the oxidation of the —$CH_2OH$ to the —$COO^-M^+$ group.

$$A\text{-}COO^-M^+ \qquad \text{Formula (2)}$$

In the formula, $M^+$ represents, for example, a hydrogen ion ($H^+$) or a cation such as a metal cation or an organic cation. Typical examples of the metal cation include $Na^+$ and $K^+$. Typical examples of the organic cation include ammonium ($NH_4^+$), alkyl ammonium, alkyl phosphonium, and the like. The group A in Formula (2) is not affected by oxidation. Therefore, A's in Formula (2) and Formula (1) have the same definition, and preferred embodiments thereof are also the same.

The term "carboxylic acid" in the description of Formula (2) includes a carboxylic acid and a carboxylate. Examples of the fluorinated carboxylic acid as the compound represented by Formula (2) include perfluorocarboxylic acid and partially fluorinated carboxylic acid. The perfluorocarboxylic acid is a carboxylic acid based on Formula (2) that does not contain a hydrogen atom except for the hydrogen atom in the —COOH group. The partially fluorinated carboxylic acid is a carboxylic acid based on Formula (2) that contains at least one fluorine atom and one hydrogen atom in addition to the hydrogen atom in the —COOH group.

Specific examples of the surfactant represented by Formula (2) in which A is represented by Formula (A1) include: $CF_3CF_2$—O—$CF_2CF_2$—O—$CF_2$—COOH, $CHF_2(CF_2)_4$—$CF_2$—COOH, $CF_3(CF_2)_5$—$CF_2$—COOH, $CF_3$—O—$(CF_2)_3$—O—$CF(CF_3)$—COOH, $CF_3CF_2CH_2$—O—$CF_2CH_2$—O—$CF_2$—COOH, $CF_3$—O—$(CF_2)_3$—O—$CHFCF_2$—COOH, $CF_3$—O—$(CF_2)_3$—O—$CF_2$—COOH, $CF_3(CF_2)_3(CH_2CF_2)_2CF_2CF_2$—$CF_2$—COOH, $CF_3(CF_2)_2CH_2CF_2$—$CF_2$—COOH, $CF_3CF_2$—$CF_2$—COOH, $CF_3(CF_2)_2$—$OCF(CF_3)CF_2$—O—$CF(CF_3)$—COOH, $CF_3(CF_2)_2$—$OCF_2CF_2$—$(OCF_2CF_2)_3$—$OCF(CF_3)$—COOH, $CF_3CF_2$—O—$CF_2CF_2$—(O—$CF_2CF_2)_2$—O—$CF_2$—COOH, salts of these (for example, ammonium perfluorooctanoate (structural formula: $CF_3(CF_2)_6COONH_4$), and the like), $R_f$—O—CHF—$COO^-M^+$, $R_f$—O—$CHFCF_2$—$COO^-M^+$, $R_f$—O—$CF_2CHF$-$COO^-M^+$, $R_f$—O—$CF_2CHFCF_2$—$COO^-M^+$, $R_f$—O—$CF_2CF_2$—$COO^-M^+$, $R_f$—O—$CF_2CF_2CF_2$—$COO^-M^+$, $R_f$—O—$CHFCF_2$—O—$CF_2$—$COO^-M^+$, $R_f$—$CHFCF_2$—O—$CF_2$—$COO^-M^+$, $R_f$—O—$(CF_2)_{n1}$—$COO^-M^+$, $R_f$—$(CF_2)_{n1}$—$COO^-M^+$, $R_f$—O—$CF_2$—(O—$CF_2)_{n1-1}$—O—$(CF_2)_m$—$COO^-M^+$, $R_f$—O—$CF_2CF_2$—(O—$CF_2CF_2)_{n1-1}$—O—$(CF_2)_m$—$COO^-M^+$, $R_f$—O—$CF(CF_3)CF_2$—(O—$CF(CF_3)CF_2)_{n1-1}$—O—$(CF_2)_m$—$COO^-M^+$, and $R_f$—O—$CF_2CF(CF_3)$—(O—$CF_2CF(CF_3))_{n1-1}$—O—$(CF_2)_m$—$COO^-M^+$ (here, $R_f$ represents a partially fluorinated alkyl group or a perfluoroalkyl group which may contain one or more oxygen atoms and is linear or branched, n1 represents 1 to 10, m1 represents 1 to 10, and $M^+$ represents $H^+$ or a cation having the definition described above).

Examples of the surfactant represented by Formula (2) in which A is represented by (A2) include $CH_3$—CHF—COOH, $C_6H_5CHFCOOH$, and the like.

As the fluorine-containing surfactant, it is possible to use the compounds described in paragraph "0045" in JP2015-045030A, paragraphs "0029" to "0031" in JP2016-

065259A, paragraphs "0030" to "0033" in JP2016-164273A, US2007/0015864B, US2007/0015865B, US2007/0015866B, US2007/0276103B, US2007/0117914B, US2007/0142541B, US2008/0015319B, U.S. Pat. Nos. 3,250,808, 3,271,341, JP2003-119204A, WO2005/042593A, WO2008/060461A, WO2007/046377A, WO2007/119526A, WO2007/046482A, and WO2007/046345A, and the like.

The octanol/water partition coefficient of the surfactant represented by LogPow is preferably equal to or smaller than 3.4. In the present specification, the octanol/water partition coefficient (LogPow) is a partition coefficient between 1-octanol and water and represented by Log P [in the formula, P represents content of surfactant in octanol/content of surfactant in water in a case where phase separation occurs in a mixture of octanol/water (1:1) containing the surfactant].

In order to determine the octanol/water partition coefficient represented by LogPow, high performance liquid chromatography (HPLC) is performed on a standard substance (heptanoic acid, octanoic acid, nonanoic acid, and decanoic acid) having a known octanol/water partition coefficient under the conditions of column: TOSOH ODS-120T column (φ 4.6 mm×250 mm), eluent: acetonitrile/0.6% by mass aqueous HClO$_4$=1/1 (vol/vol %), flow rate: 1.0 ml/min, sample amount: 300 μL, column temperature: 40° C., and detection light: UV 210 nm, creating a calibration curve by plotting the elution time and the known octanol/water partition coefficient, and calculating LogPow from the HPLC elution time of a sample liquid based on the calibration curve.

As the surfactant having LogPow equal to or smaller than 3.4, at least one kind of fluorine-containing surfactant is preferable which is selected from the group consisting of General Formula: —CF$_3$—(CF$_2$)$_4$—COO$^-$X$^+$ (in the formula, X$^+$ represents a hydrogen ion, NH$_4$, or an alkali metal ion), General Formula: CF$_3$CF$_2$CF$_2$—O—CF(CF$_3$)—COO$^-$X$^+$ (in the formula, X$^+$ represents a hydrogen ion, NH$_4$, or an alkali metal ion), General Formula: —CF$_3$—O—CF(—CF$_3$)CF$_2$—O—CF(—CF$_3$)—COO$^-$X$^+$ (in the formula, X$^+$ represents a hydrogen ion, NH$_4$, or an alkali metal ion), and General Formula: CF$_3$CF$_2$—O—CF$_2$CF$_2$—O—CF$_2$—COO$^-$X$^+$ (in the formula, X$^+$ represents a hydrogen ion, NH$_4$, or an alkali metal ion).

Examples of the fluorine-containing surfactant having LogPow equal to or smaller than 3.4 also include General Formula: CF$_3$—O—CF$_2$CF$_2$—O—CF$_2$CF$_2$—COO$^-$X$^+$(in the formula, X$^+$ represents a hydrogen ion, NH$_4$, or an alkali metal ion), General Formula: CF$_3$—O—CF$_2$CF$_2$CF$_2$—O—CHFCF$_2$—COO$^-$X$^+$(in the formula, X$^+$ represents a hydrogen ion, NH$_4$$^+$, or an alkali metal ion), and the like.

In a case where the surfactant is a salt, examples of counter ions forming the salt include an alkali metal ion, NH$^{4+}$, and the like. Examples of the alkali metal ion include Na$^+$, K$^+$, and the like.

Specific examples of the fluorine-containing surfactant having LogPow equal to or smaller than 3.4 include CF$_3$—O—CF(CF$_3$)CF$_2$—O—CF(CF$_3$)—COOH, CF$_3$—O—CF(CF$_3$)CF$_2$—OCF(CF$_3$)—COO$^-$NH$_4$$^+$, CF$_3$CF$_2$—O—CF$_2$CF$_2$—O—CF$_2$—COOH, CF$_3$CF$_2$—O—CF$_2$CF$_2$—O—CF$_2$—COO$^-$NH$_4$$^+$, CF$_3$—O—CF$_2$CF$_2$CF$_2$—O—CHFCF$_2$—COOH, CF$_3$—O—CF$_2$CF$_2$CF$_2$—O—CHFCF$_2$—COO$^-$NH$_4$$^+$, CF$_3$—(CF$_2$)$_4$—COOH, CF$_3$—(CF$_2$)$_4$—COO$^-$NH$_4$$^+$, CF$_3$CF$_2$CF$_2$—O—CF(CF$_3$)—COO$^-$NH$_4$$^+$, CF$_3$CF$_2$CF$_2$—O—CF(CF$_3$)—COOH, and the like.

<Physical Properties>

In view of obtaining a chemical liquid storage body having further improved effects of the present invention, it is preferable that the container satisfies each of conditions in the following test (hereinafter, referred to as "elution test" as well).

Elution test: under the condition that a mass ratio of a mass (unit: g) of the container to a mass (unit: g) of a test solvent containing isopropanol at a proportion equal to or higher than 99.99% by mass becomes 0.1 in a case where a liquid temperature of the test solvent is set to be 25° C., the container is immersed in the test solvent with a liquid temperature of 25° C. for 48 hours.

(Condition 1)

It is preferable that the container satisfies the following condition 1.

Condition 1: in a case where the test solvent having been used for immersion contains one kind of organic impurities, an increase in the organic impurities before and after the immersion is equal to or smaller than 1,000 mass ppm, and in a case where the test solvent having been used for immersion contains two or more kinds of organic impurities, an increase in the total content of two or more kinds of the organic impurities before and after the immersion is equal to or smaller than 1,000 mass ppm.

The lower limit of the increase in the organic impurities in the test solvent before and after the immersion is not particularly limited, and depends on a quantitative lower limit. Generally, the lower limit of the increase in the organic impurities in the test solvent before and after the immersion is preferably equal to or greater than 1.0 mass ppq. In a case where the test solvent contains two or more kinds of organic impurities, the total content thereof is preferably within the above range.

In the present specification, the organic impurities means an organic compound other than isopropanol contained among the organic compounds contained in the test solvent. The content of the organic impurities are measured using a gas chromatography mass spectrometer (trade name "GCMS-QP2020", manufactured by Shimadzu Corporation). The measurement conditions are as described in Examples. Although there is no particular limitation, in a case where the organic impurities are a high-molecular-weight compound, the techniques such as pyrolyzer-quadrupole time-of-flight/mass spectrometry (Py-QTOF/MS), pyrolyzer-ion trapping mass spectrometry (Py-IT/MS), pyrolyzer magnetic sector field mass spectrometry (Py-Sector/MS), pyrolyzer Fourier transform ion cyclotron resonance mass spectrometry (Py-FTICR-MS), pyrolyzer quadrupole mass spectrometry (Py-Q/MS), and pyrolyzer ion trap mass time-of-flight mass spectrometry (Py-IT-TOF/MS) may be used for identifying the structure or quantifying the concentration from the decomposition product. For example, for Py-QTOF/MS, a device manufactured by Shimadzu Corporation or the like can be used.

As the test solvent, a solvent is used which contains isopropanol at a proportion equal to or higher than 99.99% by mass. This solvent is commercially available as high-purity isopropanol for manufacturing semiconductors.

The elution test is performed according to the following procedure. The container and the test solvent are stored in a container for test, the entirety of the container is immersed in the test solvent and kept as it is for 48 hours in a state where the test solvent is kept at a liquid temperature of 25° C. and inhibited from being concentrated. In a case where the liquid temperature of the test solvent is set to be 25° C., the mass ratio of the mass (g) of the container to the mass (g) of the test solvent is 10%. For example, 10 g of the container is immersed in 100 g (25° C.) of the test solvent.

The container for test used in the elution test is used after being washed in advance with the test solvent used as a washing solution. As the container for test, it is preferable to use a container from which organic impurities are not eluted. In a case where organic impurities are likely to be eluted from the container for test, a blank test is performed by the following method, and the amount of organic impurities eluted from the container for test is subtracted from the result.

Blank Test

A test solvent having the same mass as the test solvent used in the elution test is stored in a container for test and kept as it is for 48 hours in a state where the test solvent is kept at a liquid temperature of 25° C. and inhibited from being concentrated. At this time, an increase in organic impurities in the test solvent before and after the elapse of 48 hours is adopted as the amount of organic impurities eluted from the container.

(Condition 2)

It is preferable that the container satisfies a condition 2 in the elution test because then the container has further improved effects of the present invention.

Condition 2: in a case where the test solvent having been used for immersion contains one kind of metal ions, an increase in the content of one kind of the metal ions before and after the immersion is equal to or smaller than 100 mass ppb, and in a case where the test solvent having been used for immersion contains two or more kinds of metal ions, an increase in the total content of two or more kinds of the metal ions before and after the immersion is equal to or smaller than 100 mass ppb.

The lower limit of the increase in the metal ions in the test solvent is not particularly limited, and depends on a quantitative lower limit. Generally, the lower limit of the increase in the metal ions in the test solvent is preferably equal to or greater than 1.0 mass ppq. In a case where the test solvent contains two or more kinds of metal ions, the total content thereof is preferably within the above range.

In the present specification, the content of metal ions means the content of metal ions measured by Single Nano Particle Inductively Coupled Plasma Mass Spectrometry (SP-ICP-MS).

The device used in SP-ICP-MS is the same as the device used in general inductively coupled mass spectrometry (ICP-MS) (hereinafter, simply referred to as "ICP-MS" as well). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present. Accordingly, the total mass of the metal particles and metal ions as a measurement target is quantified as the content of metal components.

With SP-ICP-MS, the content of metal particles is measured. Accordingly, by subtracting the content of metal particles from the content of metal components in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of metal particles can be measured by the method described in Examples. Examples of the device other than the above include NexION350S manufactured by PerkinElmer Inc., Agilent 8900 manufactured by Agilent Technologies, Inc., and the like.

Specifically, the increase in metal ions before and after the immersion is calculated by the following method.

The test solvent (25° C.) having been used for immersion is collected, and a metal ion content $MI_2$ is measured. At this time, in a case where the test solvent having been used for immersion contains two or more kinds of metal ions, $MI_2$ means the total content thereof.

By using a preliminarily measured content $MI_1$ of metal ions contained in the test solvent which is not yet used for immersion (in a case where the test solvent which is not yet used for immersion contains two or more kinds of metal ions, $MI_1$ means the total content thereof), the increase in metal ions before and after the immersion is calculated by $MI_2-MI_1$. The method of the elution test is the same as described above.

In a case where the increase in the content of metal ions before and after the immersion is equal to or smaller than 100 mass ppb, a chemical liquid storage body having further improved effects of the present invention is obtained. In view of obtaining a chemical liquid storage body having much further improved effects of the present invention, the increase in the content of metal ions before and after the immersion is more preferably 1.0 mass ppq to 1 mass ppb.

(Condition 3)

It is preferable that the container satisfies a condition 3 in the elution test because then the container has further improved effects of the present invention.

Condition 3: in a case where the test solvent having been used for immersion contains one kind of metal particles, an increase in the content of one kind of the metal particles before and after the immersion is equal to or smaller than 100 mass ppb, and in a case where the test solvent having been used for immersion contains two or more kinds of metal particles, an increase in the total content of two or more kinds of the metal particles before and after the immersion is equal to or smaller than 100 mass ppb.

The lower limit of the increase in the metal particles in the test solvent before and after the immersion is not particularly limited, and depends on a quantitative lower limit. Generally, the lower limit of the increase in the metal particles in the test solvent is preferably equal to or greater than 1.0 mass ppq. In a case where the test solvent contains two or more kinds of metal particles, the total content thereof is preferably within the above range.

The method for measuring the content of metal particles, the method for calculating the increase before and after the immersion, and the method of the elution test are as described above.

In a case where the increase in the content of metal particles before and after the immersion is equal to or smaller than 100 mass ppb, a chemical liquid storage body having further improved effects of the present invention is obtained. In view of obtaining a chemical liquid storage body having much further improved effects of the present invention, the increase in the content of metal particles before and after the immersion is more preferably 1.0 mass ppq to 1.0 mass ppb.

(Condition 4)

It is preferable that the container satisfies a condition 4 in the elution test because then the container has further improved effects of the present invention.

Condition 4: in a case where the test solvent having been used for immersion contains one kind of fluoride ions, an increase in the content of one kind of the fluoride ions before and after the immersion is equal to or smaller than 10 mass ppm, and in a case where the test solvent having been used for immersion contains two or more kinds of fluoride ions, an increase in the total content of two or more kinds of the fluoride ions before and after the immersion is equal to or smaller than 10 mass ppm.

The lower limit of the increase in the fluoride ions in the test solvent before and after the immersion is not particularly limited, and depends on a quantitative lower limit. Generally, the lower limit of the increase in the fluoride ions in the test solvent before and after the immersion is preferably equal to or greater than 0.001 mass ppt. In a case where the test solvent contains two or more kinds of fluoride ions, the total content thereof is preferably within the above range.

The content of fluoride ions in the test solvent before and after the immersion is measured by ion chromatography. The ion chromatography is performed under the following conditions by using the following device.

Used device: HIC-SP suppressor ion chromatograph manufactured by Shimadzu Corporation Used column: ion exchange resin (inner diameter: 4.0 mm, length: 25 cm)

Mobile phase: sodium hydrogen carbonate solution (1.7 mmol/L)—sodium carbonate solution (1.8 mmol/L)

Flow rate: 1.5 mL/min

Amount of sample injected: 25 μL

Column temperature: 40° C.

Suppressor: electrodialysis type

Detector: electric conductivity detector (30° C.)

(Mechanical Characteristics)

The mechanical characteristics of the composition (the container or the coating layer) forming the container are not particularly limited. Regarding hardness, the hardness of the composition measured using type D durometer based on JIS K6253 is preferably equal to or higher than D55, and more preferably equal to or higher than 60. The upper limit thereof is not particularly limited, but is preferably equal to or lower than 70 in general.

The tensile strength of the composition is not particularly limited, but is preferably equal to or higher than 25 MPa, and more preferably equal to or higher than 30 MPa. The upper limit thereof is not particularly limited, but is preferably equal to or lower than 40 MPa in general.

The coefficient of linear thermal expansion of the composition is not particularly limited, but is preferably equal to or smaller than $10 \times 10^{-5}$ (1/K), and more preferably equal to or smaller than $10 \times 10^{-3}$ (1/K). The lower limit thereof is not particularly limited, but is preferably equal to or greater than $10 \times 10^{-8}$ (1/K) in general.

<Method for Manufacturing Container>

The container can be obtained by a method of temporarily molding the composition containing a polymer by a melting molding method such as injection molding, blow molding, spin molding, and transfer molding and keep heating the obtained temporarily molded substance.

The aforementioned composition may be a composition obtained by dispersing nanocarbon material in a polymer. The composition can be prepared using known methods. As the preparation method, for example, it is possible to use the methods described in JP2009-155436A, JP2012-111680A, JP2010-254546A, JP2010-173884A, and the like.

As a method for temporarily molding the composition by a melting molding method, an injection molding method will be described. Injection molding can be performed using known injection molding machine which may be any of an inline screw type, a pre-plunger type, and the like. In a case where the temporarily molded substance is obtained using an injection molding machine, typically, examples of the molding method include a method in which the composition, which is obtained by dispersing a nanocarbon material in a polymer, is heated and melted, a cavity formed by a clamped mold is filled with the molten composition (the mold may be an injection press-type mold which is opened by a predetermined amount and then clamped after being filled), the composition filling up the mold is cooled, and then the mold is opened.

A temperature ($T_0$) at which the composition is heated and melted is not particularly limited, and is appropriately set in consideration of the fluidity of the resin and the thermal decomposition temperature of the resin. Furthermore, a mold temperature ($T_1$) is not particularly limited, and is appropriately set in consideration of the dimensional stability, the surface smoothness, the manufacturing efficiency, and the like of the temporarily molded substance to be obtained.

Generally, To is preferably selected within a range of a softening point (° C.) of a polymer+50° C. to a softening point (° C.) of a polymer+500° C., and Ti is preferably selected within a range of room temperature to 300° C.

Then, the temporarily molded substance is heated continuously. In a case where the temporarily molded substance is continuously heated, the terminal of a molecular chain of the polymer tends to be localized within the surface of the temporarily molded substance. This trend is more markedly observed in a case where the polymer is a fluorine-containing polymer. Furthermore, in a case where the fluorine-containing polymer is a treated fluorine-containing polymer in which the terminal of the molecular chain thereof is treated by being substituted with a perfluoroalkyl group, the aforementioned trend is much more markedly observed. The continuous heating treatment changes the abundance ratio between the nanocarbon material and the polymer within the surface.

A temperature ($T_2$, unit: ° C.) at which the temporarily molded substance is continuously heated satisfies $T_1<T_2$. The upper limit of $T_2$ is not particularly limited, but preferably satisfies $T_2<T_0$. The time for which the temporarily molded substance is continuously heated is appropriately selected according to the shape, the size, the thickness, and the like of the container. Generally, the time is 0.1 to 3 hours.

Thereafter, the temporarily molded substance having undergone the heating treatment is cooled to form a container. In a case where the temperature at which the container having undergone the heating treatment is cooled and the cooling rate are controlled, the degree of crystallization of the composition forming the container can be adjusted.

In a case where the melt viscosity of the polymer is high, and it is difficult to mold the composition by the melting molding method (for example, in a case where the polymer is polytetrafluoroethylene and the like), it is possible to use a method of temporarily molding the composition by a powder molding method such as compression molding, ram extrusion molding, paste extrusion molding, or isostatic molding, keep heating the obtained temporarily molded substance, and then firing the substance.

As the method for temporarily molding the composition by the powder molding method, a compression molding method will be described. The compression molding method is not particularly limited. However, typically, it is preferable that the compression molding method has the following steps.

Pre-molding step a step of filing a mold, which makes it possible to form a cavity matching with the shape of the container in the interior thereof, with the composition and compressing the composition so as to obtain a temporarily molded substance Firing step a step of heating the temporarily molded substance obtained as above at a temperature equal to or higher than the melting point of the polymer in the composition so as to form a base substance Cooling step a step of cooling the base substance obtained as above so as to obtain a container The pre-molding step is a step of pressing the components contained in the composition in a predetermined shape so as to obtain a dense temporarily molded substance. The shape of the composition is not particularly limited, but is preferably a powder shape (so-called molding powder shape).

A mold temperature $T_3$ (unit: ° C.) in the pre-molding step is not particularly limited, but is preferably room temperature to room temperature+300° C. in general. It is preferable that the pre-molding step is performed in a class 1000 clean room.

In a case where $T_3$ is too high, the nanocarbon material tends to be localized within the surface of the container. As a result, $M_1$ tends to increase while $M_2$ tends to decrease. Furthermore, in a case where $T_3$ is too high, $X_1$ tends to decrease while $X_2$ tends to increase. As a result, from the surface of the obtained container, organic impurities, metal ions, and/or metal particles tend to be easily eluted into a liquid (for example, a chemical liquid, a test solvent, and the like) stored in the container.

In contrast, in a case where $T_3$ is too low, nanocarbon material is hardly diffused. As a result, the relative content of the nanocarbon material tends to be smaller in the surface of the container than in the internal region of the container in the thickness direction. Consequently, $M_1$ tends to decrease while $M_2$ tends to increase. Furthermore, in a case where $T_3$ is too low, $X_1$ tends to increase while $X_2$ tends to decrease. As a result, from the surface of the obtained container, organic impurities, metal ions, and/or metal particles tend to be easily eluted into a liquid (for example, a chemical liquid, a test solvent, and the like) stored in the container.

More specifically, in a case where the polymer is polytetrafluoroethylene (PTFE), the mold temperature $T_3$ (° C.) is preferably 70° C. to 300° C., more preferably 80° C. to 250° C., even more preferably 90° C. to 200° C., particularly preferably 90° C. to 190° C., and most preferably 90° C. to 160° C.

The firing step is a step of fusing the components (particularly, the polymer) in the preliminarily molded substance so as to obtain an integrated base substance. A heating temperature $T_4$ (unit: ° C.) at the time of firing is preferably equal to or higher than the melting point of the polymer. Particularly, in view of obtaining a chemical liquid storage body having further improved effects of the present invention, it is preferable that $T_4$ satisfies $T_3<T_4$. The upper limit of $T_4$ is not particularly limited, but is preferably equal to or lower than the melting point of the polymer+100° C. in general. The time for which the temporarily molded substance is continuously heated may be appropriately selected according to the shape, the size, the thickness, and the like of the temporarily molded substance. Generally, the time is preferably 0.1 to 3 hours. For the firing, hot air circulating furnace can be used. It is preferable that the firing step is performed in a class 1000 clean room.

In a case where $T_4$ is too high, the nanocarbon material tends to be localized within the surface of the container. As a result, $M_1$ tends to increase while $M_2$ tends to decrease. Furthermore, in a case where $T_4$ is too high, $X_1$ tends to decrease while $X_2$ tends to increase. As a result, from the surface of the obtained container, organic impurities, metal ions, and/or metal particles tend to be easily eluted into a liquid (for example, a chemical liquid, a test solvent, and the like) stored in the container.

In contrast, in a case where $T_4$ is too low, nanocarbon material is hardly diffused. As a result, the relative content of the nanocarbon material tends to be smaller in the surface of the container than in the internal region of the container in the thickness direction. Consequently, $M_1$ tends to decrease while $M_2$ tends to increase. Furthermore, in a case where $T_4$ is too low, $X_1$ tends to increase while $X_2$ tends to decrease. As a result, from the surface of the obtained container, organic impurities, metal ions, and/or metal particles tend to be easily eluted into a liquid (for example, a chemical liquid, a test solvent, and the like) stored in the container.

More specifically, in a case where the polymer is PTFE, the heating temperature $T_4$ (° C.) is preferably 300° C. to 450° C., more preferably 350° C. to 420° C., and even more preferably 360° C. to 410° C.

The cooling step is a step of cooling the base substance obtained as above so as to obtain a container. In a case where the cooling rate and the like are controlled, a degree of crystallization of the composition in the container can be controlled. As a result, a container satisfying a predetermined condition A is obtained. Examples of the cooling method include air cooling. In a case where the base substance is cooled in the air, in order to prevent the intermixing of impurities, it is preferable to perform the cooling step in a class 1000 clean room. The cooling rate is not particularly limited, but is preferably 10° C. to 300° C./min in general. The cooling temperature is preferably 20° C. to 250° C.

The environmental temperature (atmospheric temperature) at the time of cooling is not particularly limited. In view of obtaining a container having further improved effects of the present invention, the environmental temperature is preferably 50° C. to 150° C.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained.

Accordingly, the scope of the present invention is not limited to the following examples.

[Manufacturing of Chemical Liquid Storage Body]

[Preparation of Chemical Liquid]

Chemical liquids were prepared which contained the organic solvents described in Table 1 and in which the content of impurities measured immediately after the preparation of the chemical liquid was as shown in Table 1.

The purchased commercial chemical liquids shown in Table 1 were passed through the filters described in the columns of "Filter 1" to "Filter 3", thereby manufacturing the chemical liquids.

"PTFE 50 nm" described in the above columns means a filter made of polytetrafluoroethylene having a pore size of 50 nm, "PTFE 20 nm" described in the above columns means a filter made of polytetrafluoroethylene having a pore size of 20 nm, "PTFE 10 nm" described in the above columns means a filter made of polytetrafluoroethylene having a pore size of 10 nm, and "PTFE 5 nm" described in the above columns means a filter made of polytetrafluoroethylene having a pore size of 5 nm.

The filters used in examples and comparative examples were washed in advance by the method described in the column of "Preliminary washing". In the column of "Preliminary washing", "1" means that the filter was immersed in PGMEA (30° C.) and treated with ultrasound (output: 100 W) for 1 hour, "2" means that the filter was immersed in PGMEA (25° C.) and treated with ultrasound (output: 100 W) for 1 week, "3" means that the filter was immersed in PGMEA (30° C.) for 1 week, "4" means that the filter was immersed in PGMEA (30° C.) for 3 days, "5" means that the filter was immersed in PGMEA (30° C.) and treated with ultrasound (output: 50W) for 1 hour, "6" means that the filter was immersed in IPA (30° C.) for 2 weeks, "7" means that the filter was immersed in IPA (30° C.) for 1 week, and "8" means that the filter was immersed in IPA (30° C.) for 3 days.

In the table, "3→1" means that washing in "3" described above was performed and then washing in "1" described above was performed.

The abbreviations in Table 1 represent the following organic solvents.
PGMM: propylene glycol monomethyl ether
PGME: propylene glycol monoethyl ether
PGMP: propylene glycol monopropyl ether
PGMEA: propylene glycol monomethyl ether acetate
EL: ethyl lactate
MPM: methyl methoxypropionate
CyPn: cyclopentanone
CyHe: cyclohexanone
γBL: γ-butyrolactone
DIAE: diisoamyl ether
nBA: butyl acetate
iAA: isoamyl acetate
Hexane: hexane
MAK: 2-heptanone
IPA: isopropanol
PGMEA/PGME (v/v=7/3): propylene glycol monomethyl ether acetate/propylene glycol monoethyl ether (volume ratio)

[Preparation of Composition]

The polymer, the nanocarbon material, and the surfactant described in the column of "Container" in Table 1 were mixed together according to the composition described in Table 1, thereby obtaining a composition.
PTFE: polytetrafluoroethylene (manufactured by DAIKIN INDUSTRIES, LTD.)
PFA: perfluoroalkoxyalkane (manufactured by DAIKIN INDUSTRIES, LTD.)
HDPE: high density polyethylene (manufactured by Mitsubishi Chemical Corporation)
PP: polypropylene (manufactured by SUMITOMO SEIKA CHEMICALS CO., LTD.)

Among the polymers, PFA for which "Performed" is described in the column of "Surface modification" means that the used polymer had terminals treated with fluorine and hence modified the surface of the content with —$CF_3$.

At this time, the following surfactants were used. The numerical value in the parenthesis represents LogPow.
1: $CF_3(CF_2)_4COOH$ (3.15)
2: $CF_3CF_2CF_2OCF(CF_3)COOH$ (4.98)
3: $CF_3OCF(CF_3)CF_2OCF(CF_3)COOH$ (6.37)
4: $CF_3CF_2OCF_2CF_2OCF_2COOH$ (6.29)
5: $CF_3(CF_2)_6COOH$ (3.62)

[Formation of Container]

The composition containing the polymer, the nanocarbon material, and the surfactant shown in each column in Table 1 was subjected to injection molding or compression molding, thereby obtaining temporarily molded substance. The temperature of a mold for molding is shown in "Mold temperature (° C.)" in Table 1. In the column of "Type" in the column of "Molding method" in tables which will be described later, "1" means that "injection molding" was performed, and "2" means that "compression molding" was performed.

Then, in a state where temperature and humidity were being precisely controlled, the temporarily molded substance obtained as above was subjected to a thermal treatment using a firing furnace at the temperature described in "Heating treatment temperature (° C.)" in Table 1, thereby obtaining base substance. Thereafter, the base substance was cooled to the atmospheric temperature described in "Cooling temperature (° C.)" in Table 1, thereby obtaining a container. The chemical liquid containing an organic solvent described in the column of "Chemical liquid" in Table 1 was stored in the container obtained as above, thereby obtaining a chemical liquid storage body. The content of impurities contained in the chemical liquid prepared is as shown in Table 1.

PP and HDPE are materials used for preparing the container.

[Measurement of $M_1$ and $M_2$]

$M_1$ was measured using atomic force microscopy infrared spectroscopy (AFM-IR, "nanoIR1" manufactured by Anasys Instruments Corp.). Regarding the measurement condition, $M_1$ was measured using a variable wavelength laser by scanning within a range of 900 to 3,600 $cm^{-1}$.

$M_2$ was measured by the following method by using a scattering-type near field microscope (manufactured by Hitachi High-Technologies Corporation).
Scan area 10 um×10 um
Aperture diameter 80 nm
Optical range of near field <100 nm
Measurement spots 10 spots
Pixel size: 20 nm
Acquisition time: 80 s

[Measurement of $A_1$, $A_2$, $X_1$, and $X_2$]

$A_1$, $A_2$, $X_1$, and $X_2$ were measured under the following conditions by using a time-of-flight secondary ion mass spectrometer (manufactured by ION-TOF GmbH, trade name: "TOF-SIMS5").
Primary ion: $Bi_{32}+$
Primary ion accelerating voltage: 25 kV
Measurement area: 500 μm×500 μm
Measurement temperature: equal to or lower than −100° C.

A sample was irradiated with Ar gas cluster ion beams (Ar-GCIB) for etching and with $Bi^{3+}$ as a primary ion source, and the obtained secondary ions were analyzed using a time-of-flight mass spectrometer, thereby obtaining a spectrum.

Because the value obtained by the above measurement method was expressed using atom/$cm^2$, the number of moles was calculated from the numerical value and multiplied by the number of atoms (number of molecules) so as to convert the value into mass.
Ar-GCIB injection pressure: 3 MPa
Measurement area: 150 μm×150 μm
Measurement mode: high-resolution mass spectrometry The elution test was performed on the obtained container by the following method.

The results are shown in Table 1.

[Elution Test]

Each of the containers prepared as above was immersed for 48 hours in a test solvent (manufactured by FUJIFILM Ultra Pure Solutions, INC.) containing isopropanol at a proportion equal to or higher than 99.99% by mass at a liquid temperature of 25° C. The amount of the isopropanol was 10 times (unit: g/g) the amount of the container based on mass. The increase in the content of each impurity contained in the test solvent before and after the immersion was measured by the following method. The results are shown in Table 1.

(Metal Particles and Metal Ions)

For the measurement, Agilent 8800 triple quadrupole inductively coupled plasma mass spectrometry (ICP-MS, for semiconductor analysis, option #200) was used. Based on the measurement results, the content of metal particles and the content of metal ions were determined.

Measurement Conditions

As a sample introduction system, a quartz torch, a coaxial perfluoroalkoxyalkane (PFA) nebulizer (for self-suction), and a platinum interface cone were used. The measurement parameters of cool plasma conditions are as below.

Output of Radio Frequency (RF) (W): 600
Flow rate of carrier gas (L/min): 0.7
Flow rate of makeup gas (L/min): 1
Sampling depth (mm): 18

(Organic Impurities)

For the measurement, a gas chromatography mass spectrometer (trade name "GCMS-2020", manufactured by Shimadzu Corporation, the measurement conditions were as described below) was used.

(Measurement Conditions)

Capillary column: InertCap 5MS/NP 0.25 mmI.D.×30 m df=0.25 μm
Sample introduction method: split 75 kPa constant pressure
Vaporizing chamber temperature: 230° C.
Column oven temperature: 80° C. (2 min)-500° C. (13 min)
Heating rate 15° C./min
Carrier gas: helium
Septum purge flow rate: 5 mL/min
Split ratio: 25:1
Interface temperature: 250° C.
Ion source temperature: 200° C.
Measurement mode: Scan m/z=85-500
Amount of sample introduced: 1 μL

[Electro-Static-Discharge (ESD) Inhibition Performance]

The antistatic properties of the chemical liquid storage body were evaluated based on ESD inhibition performance measured by the following method. The chemical liquid storage body was filled with a chemical liquid, a lid was put on the container, and the chemical liquid storage body was shaken up and down for 1 hour by using a "sieve shaker" under the condition of 30 times/1 min. Then, the state where static electricity accumulated on the container and caused sparks and a degree of occurrence of pinholes or cracks in the container were visually inspected "AA": The container was not broken, and no scratch causing cracks and/or pinholes was checked on the container.

"A": Although the container was not broken, shallow scratches causing cracks and/or pinholes were checked on the container.

"B": Although the container was not broken, a number of shallow scratches causing cracks and/or pinholes were checked on the container.

"C": Although the container was not broken, deep scratches causing cracks and/or pinholes were checked on the container.

"D": Although the container was not broken, a number of deep scratches causing cracks and/or pinholes were checked on the container.

"E": Broken sites were checked on the container.

[Evaluation of Defect Inhibition Performance of Chemical Liquid]

First, a silicon oxide film substrate having a diameter of 300 mm was prepared.

Then, by using a wafer surface inspection device (SP-5; manufactured by KLA-Tencor Corporation), the number of particles (hereinafter, referred to as "defects") having a diameter equal to or greater than 32 nm that were present on the substrate was counted (the counted number was adopted as an initial value). Subsequently, the substrate was set in a spin jetting device, and while the substrate was being rotated, each of the chemical liquids was jetted to the surface of the substrate at a flow rate of 1.5 L/min. Thereafter, the substrate was spin-dried.

Then, by using the aforementioned device (SP-5), the number of defects present on the substrate having been coated with the chemical liquid was counted (the counted number was adopted as a counted value). Thereafter, a difference between the initial value and the counted value (initial value−counted value) was calculated. Based on the following standards, the obtained result was evaluated.

The above test was performed for the chemical liquid immediately after the chemical liquid was prepared. The results are described in Table 1 as "Initial defect inhibition performance". Then, after being prepared, the chemical liquid was stored for 1 month at 25° C. in the aforementioned container, and then the above test was performed on the chemical liquid. The results are described in Table 1 as "Defect inhibition performance after 1 month of storage".

"AA": The difference between the initial value and the counted value of the number of defects was equal to or smaller than 100.

"A": The difference between the initial value and the counted value of the number of defects was greater than 100 and equal to or smaller than 300.

"B": The difference between the initial value and the counted value of the number of defects was greater than 300 and equal to or smaller than 500.

"C": The difference between the initial value and the counted value of the number of defects was greater than 500 and equal to or smaller than 1,000.

"D": The difference between the initial value and the counted value of the number of defects was greater than 1,000 and equal to or smaller than 1,500.

"E": The difference between the initial value and the counted value of the number of defects was greater than 1,500.

[Content of Impurities in Chemical Liquid after 1 Month of Storage]

The content of metal ions, metal particles, and organic impurities in the chemical liquid, which had been stored for 1 month at 25° C. in the container after being prepared, was measured by the method described above. The results are shown in Table 1.

$M_1$, $M_2$, $A_1$, $A_2$, $X_1$, and $X_2$ shown in examples are values determined for the entire surface of the liquid contact portion of the container in each of the examples.

Compounds 1 to 4, compounds 8 to 14, compounds 23 to 25, and compounds 28 to 33 in tables that will be described later mean the following compounds.

The boiling point of the compound 1 was 683° C., the boiling point of the compound 2 was 702° C., the boiling point of the compound 3 was 720° C., and the boiling point of the compound 4 was 652° C.
Compound 1
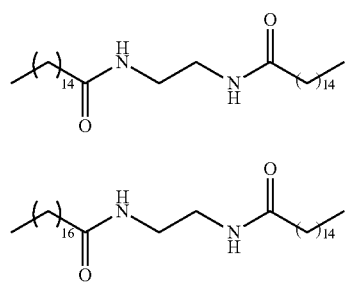
Compound 2
Compound 3
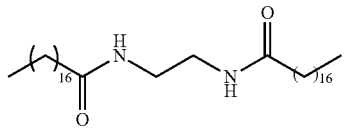
Compound 4
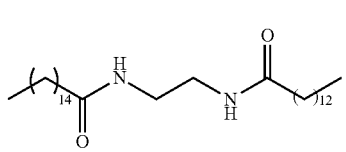
in $L_1$ in the compound 8 and the compound 9 represents a binding position.
Compound 8
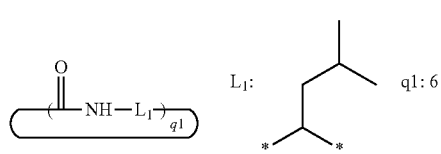
Compound 9
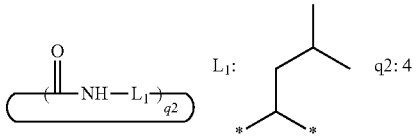
Compound 10
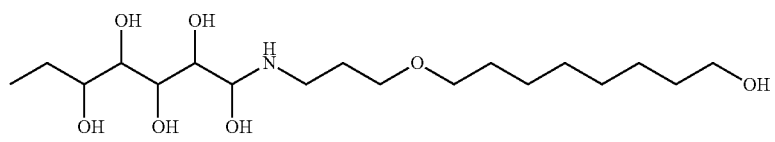
Compound 11
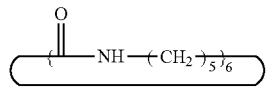
Compound 12
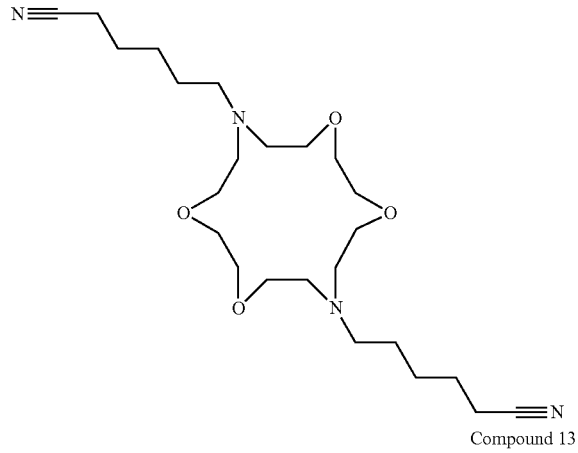
Compound 13
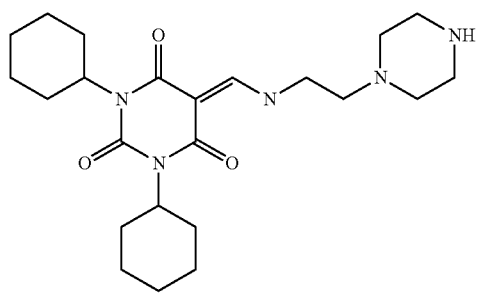
Compound 14
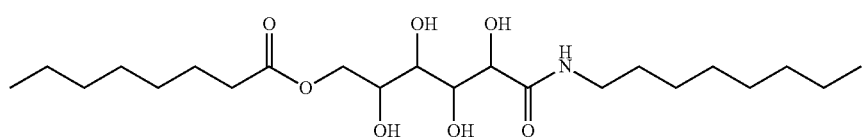

-continued
Compound 19
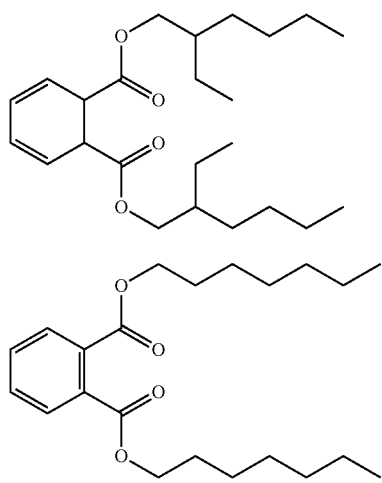
Compound 20
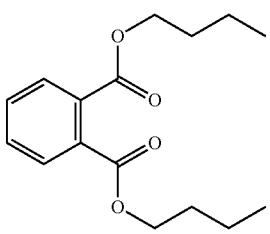
Compound 21
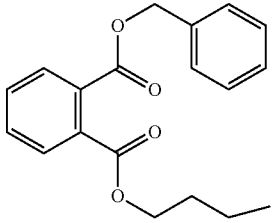
Compound 22
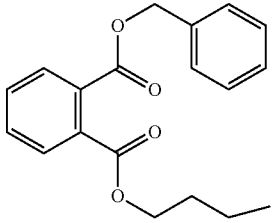
Compound 28
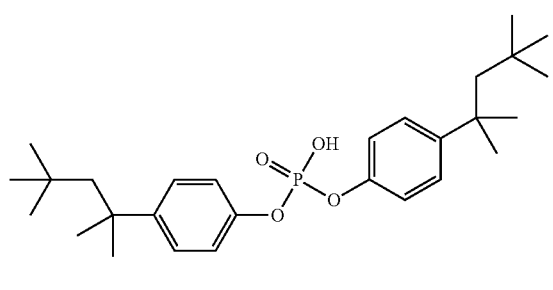
Compound 29
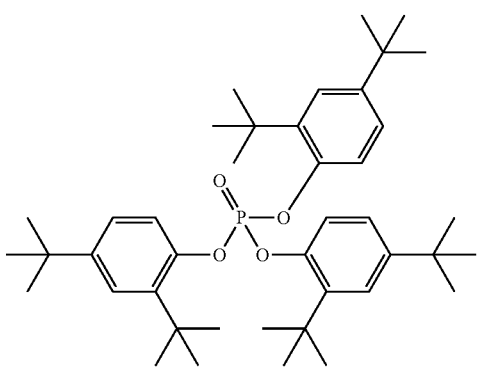
Compound 30
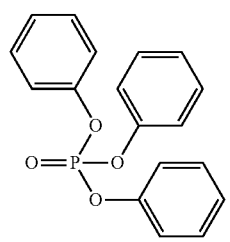
Compound 31
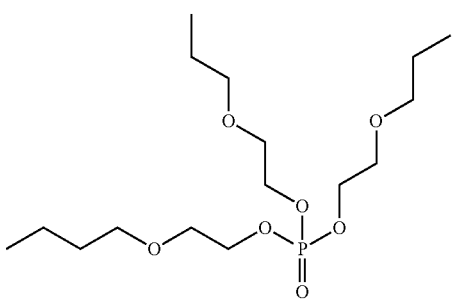
Compound 32
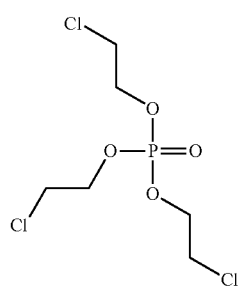
Compound 33
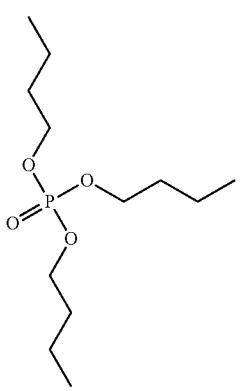
(?) indicates text missing or illegible when filed In the tables, the column of "Ratio" shows the ratio of the total content of the compounds represented by General Formula (I) to General Formula (IV) to the content of metal components.

TABLE 1

| Table 1-1-1 | Preparation of chemical liquid | | | | Chemical liquid | | Content of impurities immediately after preparation | |
|---|---|---|---|---|---|---|---|---|
| | Preliminary washing | Filter 1 | Filter 2 | Filter 3 | Organic solvent Type | Organic solvent Conductivity (× 10$^{-6}$ S/m) | Metal ions (Mass ppt) | Metal particles (Mass ppt) |
| Example 1 | 1 | PTFE 20 nm | PTFE 10 nm | | PGMM | 3 | 6.0 | 3.6 |
| Example 2 | 1 | PTFE 20 nm | PTFE 10 nm | | PGME | <1 | 4.0 | 2.4 |
| Example 3 | 1 | PTFE 20 nm | PTFE 10 nm | | PGMP | <1 | 8.0 | 4.8 |
| Example 4 | 1 | PTFE 20 nm | PTFE 10 nm | | PGMEA | <1 | 6.0 | 3.6 |
| Example 5 | 1 | PTFE 20 nm | PTFE 10 nm | | EL | <1 | 10.0 | 6.0 |
| Example 6 | 1 | PTFE 20 nm | PTFE 10 nm | | MPM | <1 | 4.0 | 2.4 |
| Example 7 | 1 | PTFE 20 nm | PTFE 10 nm | | CyPn | <1 | 8.0 | 4.8 |
| Example 8 | 1 | PTFE 20 nm | PTFE 10 nm | | CyHe | 5 | 10.0 | 6.0 |
| Example 9 | 1 | PTFE 20 nm | PTFE 10 nm | | γBL | <1 | 4.0 | 2.4 |
| Example 10 | 1 | PTFE 20 nm | PTFE 10 nm | | DIAE | <1 | 12.0 | 7.2 |
| Example 11 | 1 | PTFE 20 nm | PTFE 10 nm | | nBA | 1.3 | 6.0 | 3.6 |
| Example 12 | 1 | PTFE 20 nm | PTFE 10 nm | | iAA | <1 | 6.0 | 3.6 |
| Example 13 | 1 | PTFE 20 nm | PTFE 10 nm | | Hexane | 1 | 8.0 | 4.8 |
| Example 14 | 1 | PTFE 20 nm | PTFE 10 nm | | MAK | <1 | 6.0 | 3.6 |
| Example 15 | 1 | PTFE 20 nm | PTFE 10 nm | | IPA | 6 | 4.0 | 2.4 |
| Example 16 | 1 | PTFE 20 nm | PTFE 10 nm | | PGMEA/PGME (v/v = 7/3) | <1 | 4.0 | 2.4 |
| Example 17 | 1 | PTFE 10 nm | PTFE 5 nm | | nBA | 1.3 | 8.0 | 4.8 |
| Example 18 | 1 | PTFE 10 nm | PTFE 5 nm | | nBA | 1.3 | 8.0 | 4.8 |
| Example 19 | 1 | PTFE 10 nm | PTFE 5 nm | | nBA | 1.3 | 8.0 | 4.8 |
| Example 20 | 1 | PTFE 10 nm | PTFE 5 nm | | nBA | 1.3 | 8.0 | 4.8 |
| Example 21 | 1 | PTFE 10 nm | PTFE 5 nm | PTFE 5 nm | CyHe | 5 | 8.0 | 4.8 |
| Example 22 | 1 | PTFE 10 nm | PTFE 5 nm | PTFE 5 nm | CyHe | 5 | 8.0 | 4.8 |
| Example 23 | 1 | PTFE 10 nm | PTFE 5 nm | PTFE 5 nm | CyHe | 5 | 8.0 | 4.8 |
| Example 24 | 1 | PTFE 10 nm | PTFE 5 nm | PTFE 5 nm | CyHe | 5 | 8.0 | 4.8 |
| Example 25 | 1 | PTFE 10 nm | PTFE 5 nm | PTFE 5 nm | CyHe | 5 | 8.0 | 4.8 |
| Example 26 | 1 | PTFE 10 nm | PTFE 5 nm | PTFE 5 nm | CyHe | 5 | 8.0 | 4.8 |
| Example 27 | 1 | PTFE 10 nm | PTFE 5 nm | PTFE 5 nm | CyHe | 5 | 8.0 | 4.8 |
| Example 28 | 1 | PTFE 10 nm | PTFE 5 nm | PTFE 5 nm | CyHe | 5 | 8.0 | 4.8 |
| Example 29 | 1 | PTFE 10 nm | PTFE 5 nm | PTFE 5 nm | CyHe | 5 | 8.0 | 4.8 |
| Example 30 | 1 | PTFE 10 nm | PTFE 5 nm | PTFE 5 nm | CyHe | 5 | 8.0 | 4.8 |

TABLE 2

| Table 1-1-2 | Chemical liquid | | | | | | | |
|---|---|---|---|---|---|---|---|---|
| | General Formula (I) | | General Formula (II) | | General Formula (III) | | General Formula (IV) | |
| | Content (Mass ppt) | Type | Content (Mass ppt) | Type | Content (Mass ppt) | Type | Content (Mass ppt) | Type |
| Example 1 | 96 | Compound 1-4 | 36 | Compound 8 | 22.5 | Compound 19-22 | | |
| Example 2 | 64 | Compound 1-4 | | | 18 | Compound 19-22 | 20 | Compound 28-33 |
| Example 3 | 128 | Compound 1-4 | 48 | Compound 8 | 22.5 | Compound 19-22 | | |
| Example 4 | 96 | Compound 1-4 | | | 15 | Compound 19-22 | | |
| Example 5 | 160 | Compound 1-4 | | | 27 | Compound 19-22 | 50 | Compound 28-33 |
| Example 6 | 64 | Compound 1-4 | | | 21 | Compound 19-22 | 20 | Compound 28-33 |
| Example 7 | 16 | Compound 1-4 | 48 | Compound 8-14 | 24 | Compound 19-22 | 40 | Compound 28-33 |
| Example 8 | 48 | Compound 1-4 | 60 | Compound 8-14 | 37.5 | Compound 19-22 | 50 | Compound 28-33 |
| Example 9 | 64 | Compound 1-4 | | | 18 | Compound 19-22 | 20 | Compound 28-33 |
| Example 10 | 192 | Compound 1-4 | 72 | Compound 8 | 22.5 | Compound 19-22 | 60 | Compound 28-33 |
| Example 11 | 96 | Compound 1-4 | 36 | Compound 8 | 13.5 | Compound 19-22 | 30 | Compound 28-33 |
| Example 12 | 96 | Compound 1-4 | | | 36 | Compound 19-22 | | |
| Example 13 | 128 | Compound 1-4 | 48 | Compound 8 | 37.5 | Compound 19-22 | | |
| Example 14 | 96 | Compound 1-4 | | | 28.5 | Compound 19-22 | 30 | Compound 28-33 |
| Example 15 | 64 | Compound 1-4 | | | 22.5 | Compound 19-22 | 20 | Compound 28-33 |
| Example 16 | 64 | Compound 1-4 | | | 15 | Compound 19-22 | | |
| Example 17 | 80 | Compound 1-4 | 30 | Compound 8 | 24 | Compound 19-22 | 25 | Compound 28-33 |
| Example 18 | 80 | Compound 1-4 | 30 | Compound 8 | 18 | Compound 19-22 | 25 | Compound 28-33 |
| Example 19 | 80 | Compound 1-4 | 30 | Compound 8 | 22.5 | Compound 19-22 | 25 | Compound 28-33 |
| Example 20 | 80 | Compound 1-4 | 30 | Compound 8 | 16.5 | Compound 19-22 | 25 | Compound 28-33 |
| Example 21 | 80 | Compound 1-4 | 30 | Compound 8 | 9 | Compound 19-22 | 25 | Compound 28-33 |
| Example 22 | 80 | Compound 1-4 | 30 | Compound 8 | 11.25 | Compound 19-22 | 25 | Compound 28-33 |
| Example 23 | 80 | Compound 1-4 | 30 | Compound 8 | 12.75 | Compound 19-22 | 25 | Compound 28-33 |
| Example 24 | 80 | Compound 1-4 | 30 | Compound 8 | 18 | Compound 19-22 | 25 | Compound 28-33 |
| Example 25 | 80 | Compound 1-4 | 30 | Compound 8 | 22.5 | Compound 19-22 | 25 | Compound 28-33 |
| Example 26 | 80 | Compound 1-4 | 30 | Compound 8 | 24 | Compound 19-22 | 25 | Compound 28-33 |
| Example 27 | 80 | Compound 1-4 | 30 | Compound 8 | 18 | Compound 19-22 | 25 | Compound 28-33 |
| Example 28 | 80 | Compound 1-4 | 30 | Compound 8 | 12 | Compound 19-22 | 25 | Compound 28-33 |
| Example 29 | 80 | Compound 1-4 | 30 | Compound 8 | 12.75 | Compound 19-22 | 25 | Compound 28-33 |
| Example 30 | 80 | Compound 1-4 | 30 | Compound 8 | 18 | Compound 19-22 | 25 | Compound 28-33 |

TABLE 3

| Table 1-1-3 | Ratio | Container Type of polymer Type | Terminal modification | Nannocarbon material (carbon nanotubes) Major acis(μm) | Content (Mass %) | $M_1$ | $M_2$ | $M_1/M_2$ | $M_2/A_2$ |
|---|---|---|---|---|---|---|---|---|---|
| Example 1 | 0.062 | PTFE | — | 100 | 0.05 | 0.05 | 0.1 | 0.5 | 1,000 |
| Example 2 | 0.063 | PTFE | — | 100 | 0.05 | 0.05 | 0.1 | 0.5 | 1,000 |
| Example 3 | 0.064 | PTFE | — | 100 | 0.05 | 0.05 | 0.1 | 0.5 | 1,000 |
| Example 4 | 0.086 | PTFE | — | 100 | 0.05 | 0.05 | 0.1 | 0.5 | 1,000 |
| Example 5 | 0.068 | PTFE | — | 100 | 0.05 | 0.05 | 0.1 | 0.5 | 1,000 |
| Example 6 | 0.061 | PTFE | — | 100 | 0.05 | 0.05 | 0.1 | 0.5 | 1,000 |
| Example 7 | 0.100 | PTFE | — | 100 | 0.05 | 0.05 | 0.1 | 0.5 | 1,000 |
| Example 8 | 0.082 | PTFE | — | 100 | 0.05 | 0.05 | 0.1 | 0.5 | 1,000 |
| Example 9 | 0.063 | PTFE | — | 100 | 0.05 | 0.05 | 0.1 | 0.5 | 1,000 |
| Example 10 | 0.055 | PTFE | — | 100 | 0.05 | 0.05 | 0.1 | 0.5 | 1,000 |
| Example 11 | 0.055 | PTFE | — | 100 | 0.05 | 0.05 | 0.1 | 0.5 | 1,000 |
| Example 12 | 0.073 | PTFE | — | 100 | 0.05 | 0.05 | 0.1 | 0.5 | 1,000 |
| Example 13 | 0.060 | PTFE | — | 100 | 0.05 | 0.05 | 0.1 | 0.5 | 1,000 |
| Example 14 | 0.062 | PTFE | — | 100 | 0.05 | 0.05 | 0.1 | 0.5 | 1,000 |
| Example 15 | 0.060 | PTFE | — | 100 | 0.05 | 0.05 | 0.1 | 0.5 | 1,000 |
| Example 16 | 0.081 | PTFE | — | 100 | 0.05 | 0.05 | 0.1 | 0.5 | 1,000 |
| Example 17 | 0.081 | PTFE | — | 300 | 0.05 | 0.05 | 0.1 | 0.5 | 1,000 |
| Example 18 | 0.084 | PTFE | — | 1,000 | 0.05 | 0.05 | 0.1 | 0.5 | 1,000 |
| Example 19 | 0.081 | PTFE | — | 1200 | 0.05 | 0.05 | 0.1 | 0.5 | 1,000 |
| Example 20 | 0.084 | PTFE | — | 100 | 0.001 | 0.08 | 0.16 | 0.5 | 1,000 |
| Example 21 | 0.089 | PTFE | — | 100 | 0.5 | 0.15 | 0.300 | 0.5 | 1,000 |
| Example 22 | 0.088 | PTFE | — | 100 | 0.65 | 0.2 | 0.4 | 0.5 | 1,000 |
| Example 23 | 0.087 | PTFE | — | 100 | 0.05 | 0.05 | 0.056 | 0.9 | 2,000,000 |
| Example 24 | 0.084 | PTFE | — | 100 | 0.05 | 0.05 | 0.063 | 0.8 | 1,000,000 |
| Example 25 | 0.081 | PTFE | — | 100 | 0.05 | 0.05 | 0.071 | 0.7 | 20,000 |
| Example 26 | 0.081 | PTFE | — | 100 | 0.05 | 0.05 | 0.10 | 0.5 | 3,000 |
| Example 27 | 0.084 | PTFE | — | 100 | 0.05 | 0.05 | 0.13 | 0.4 | 300 |
| Example 28 | 0.087 | PTFE | — | 100 | 0.05 | 0.05 | 0.10 | 0.5 | 50 |
| Example 29 | 0.087 | PTFE | — | 100 | 0.05 | 0.05 | 5.00 | 0.01 | 10 |
| Example 30 | 0.084 | PTFE | — | 100 | 0.05 | 0.05 | 0.06 | 0.8 | 1,000 |

TABLE 4

| Table 1-4 | Container Surfactant Type | Content (Mass %) | $A_1$ (Mass %) | $A_2$ (Mass %) | $A_1/A_2$ | F/C $X_1$ | $X_2$ |
|---|---|---|---|---|---|---|---|
| Example 1 | 1 | 1.0 | 0.03 | 0.30 | 0.1 | 1.9 | 1.5 |
| Example 2 | 1 | 1.0 | 0.03 | 0.30 | 0.1 | 1.9 | 1.5 |
| Example 3 | 1 | 1.0 | 0.03 | 0.30 | 0.1 | 1.9 | 1.5 |
| Example 4 | 1 | 1.0 | 0.03 | 0.30 | 0.1 | 1.9 | 1.5 |
| Example 5 | 1 | 1.0 | 0.03 | 0.30 | 0.1 | 1.9 | 1.5 |
| Example 6 | 1 | 1.0 | 0.03 | 0.30 | 0.1 | 1.9 | 1.5 |
| Example 7 | 1 | 1.0 | 0.03 | 0.30 | 0.1 | 1.9 | 1.5 |
| Example 8 | 1 | 1.0 | 0.03 | 0.30 | 0.1 | 1.9 | 1.5 |
| Example 9 | 1 | 1.0 | 0.03 | 0.30 | 0.1 | 1.9 | 1.5 |
| Example 10 | 1 | 1.0 | 0.03 | 0.30 | 0.1 | 1.9 | 1.5 |
| Example 11 | 1 | 1.0 | 0.03 | 0.30 | 0.1 | 1.9 | 1.5 |
| Example 12 | 1 | 1.0 | 0.03 | 0.30 | 0.1 | 1.9 | 1.5 |
| Example 13 | 1 | 1.0 | 0.03 | 0.30 | 0.1 | 1.9 | 1.5 |
| Example 14 | 1 | 1.0 | 0.03 | 0.30 | 0.1 | 1.9 | 1.5 |
| Example 15 | 1 | 1.0 | 0.03 | 0.30 | 0.1 | 1.9 | 1.5 |
| Example 16 | 1 | 1.0 | 0.03 | 0.30 | 0.1 | 1.9 | 1.5 |
| Example 17 | 1 | 1.0 | 0.03 | 0.30 | 0.1 | 1.9 | 1.5 |
| Example 18 | 1 | 1.0 | 0.03 | 0.30 | 0.1 | 1.9 | 1.5 |
| Example 19 | 1 | 1.0 | 0.03 | 0.30 | 0.1 | 1.9 | 1.5 |
| Example 20 | 1 | 1.0 | 0.03 | 0.30 | 0.1 | 1.9 | 0.9 |
| Example 21 | 1 | 1.0 | 0.03 | 0.30 | 0.1 | 1.85 | 1.7 |
| Example 22 | 1 | 1.0 | 0.03 | 0.30 | 0.1 | 1.9 | 1.8 |
| Example 23 | 1 | 0.0005 | 0.00001 | 0.0002 | 0.05 | 1.9 | 1.5 |
| Example 24 | 1 | 0.001 | 0.0001 | 0.0003 | 0.3 | 1.9 | 1.5 |
| Example 25 | 1 | 0.1 | 0.005 | 0.01 | 0.5 | 1.9 | 1.5 |
| Example 26 | 1 | 0.3 | 0.05 | 0.05 | 1 | 1.9 | 1.5 |
| Example 27 | 1 | 3.0 | 0.1 | 1.00 | 0.1 | 1.9 | 1.5 |
| Example 28 | 1 | 5.0 | 0.2 | 2.00 | 0.1 | 1.9 | 1.5 |
| Example 29 | 1 | 10.0 | 0.5 | 5.00 | 0.1 | 1.9 | 1.5 |
| Example 30 | 1 | 1.0 | 0.03 | 0.04 | 0.8 | 1.8 | 1.6 |

TABLE 5

| Table 1-1-5 | Container Molding method Type | Mold temperature (° C.) | Heating treatment temperature (° C.) | Cooling temperature (° C.) |
|---|---|---|---|---|
| Example 1 | 1 | 150 | 380 | 100 |
| Example 2 | 1 | 150 | 380 | 100 |
| Example 3 | 1 | 150 | 380 | 100 |
| Example 4 | 1 | 150 | 380 | 100 |
| Example 5 | 1 | 150 | 380 | 100 |
| Example 6 | 1 | 150 | 380 | 100 |
| Example 7 | 1 | 150 | 380 | 100 |
| Example 8 | 1 | 150 | 380 | 100 |
| Example 9 | 1 | 150 | 380 | 100 |
| Example 10 | 1 | 150 | 380 | 100 |
| Example 11 | 1 | 150 | 380 | 100 |
| Example 12 | 1 | 150 | 380 | 100 |
| Example 13 | 1 | 150 | 380 | 100 |
| Example 14 | 1 | 150 | 380 | 100 |

TABLE 5-continued

| | Container Molding method | | | |
|---|---|---|---|---|
| Table 1-1-5 | Type | Mold temperature (° C.) | Heating treatment temperature (° C.) | Cooling temperature (° C.) |
| Example 15 | 1 | 150 | 380 | 100 |
| Example 16 | 1 | 150 | 380 | 100 |
| Example 17 | 1 | 150 | 380 | 100 |
| Example 18 | 1 | 150 | 380 | 100 |
| Example 19 | 1 | 150 | 380 | 100 |
| Example 20 | 1 | 150 | 380 | 100 |
| Example 21 | 1 | 150 | 380 | 100 |
| Example 22 | 1 | 150 | 380 | 100 |
| Example 23 | 1 | 150 | 380 | 100 |
| Example 24 | 1 | 150 | 380 | 100 |
| Example 25 | 1 | 150 | 380 | 100 |
| Example 26 | 1 | 150 | 380 | 100 |
| Example 27 | 1 | 150 | 380 | 100 |
| Example 28 | 1 | 150 | 380 | 100 |
| Example 29 | 1 | 150 | 380 | 100 |
| Example 30 | 1 | 170 | 380 | 100 |

TABLE 6

| | Container | | | | |
|---|---|---|---|---|---|
| | Elution test: increase in impurities before and after immersion | | | Content of impurities in chemical liquid after elapse of time | |
| Table 1-1-6 | Metal ions (Mass ppt) | Metal particles (Mass ppt) | Organic impurities (Mass ppt) | Metal ions (Mass ppt) | Metal particles (Mass ppt) |
| Example 1 | 3.0 | 1.8 | 205 | 9.0 | 5.4 |
| Example 2 | 2.0 | 1.2 | 152 | 6.0 | 3.6 |
| Example 3 | 4.0 | 2.4 | 249 | 12.0 | 7.2 |
| Example 4 | 3.0 | 1.8 | 161 | 9.0 | 5.4 |
| Example 5 | 5.0 | 3.0 | 287 | 15.0 | 9.0 |
| Example 6 | 2.0 | 1.2 | 155 | 6.0 | 3.6 |
| Example 7 | 4.0 | 2.4 | 178 | 12.0 | 7.2 |
| Example 8 | 5.0 | 3.0 | 246 | 15.0 | 9.0 |
| Example 9 | 2.0 | 1.2 | 152 | 6.0 | 3.6 |
| Example 10 | 6.0 | 3.6 | 397 | 18.0 | 10.8 |
| Example 11 | 3.0 | 1.8 | 226 | 9.0 | 5.4 |
| Example 12 | 3.0 | 1.8 | 182 | 9.0 | 5.4 |
| Example 13 | 4.0 | 2.4 | 264 | 12.0 | 7.2 |
| Example 14 | 3.0 | 1.8 | 205 | 9.0 | 5.4 |
| Example 15 | 2.0 | 1.2 | 157 | 6.0 | 3.6 |
| Example 16 | 2.0 | 1.2 | 129 | 6.0 | 3.6 |
| Example 17 | 10.0 | 6.0 | 209 | 18.0 | 10.8 |
| Example 18 | 30.0 | 18.0 | 203 | 38.0 | 22.8 |
| Example 19 | 70.0 | 42.0 | 208 | 78.0 | 46.8 |
| Example 20 | 1.0 | 0.6 | 202 | 9.0 | 5.4 |
| Example 21 | 180.0 | 108.0 | 194 | 188.0 | 112.8 |
| Example 22 | 200.0 | 120.0 | 196 | 208.0 | 124.8 |
| Example 23 | 8.0 | 4.8 | 198 | 16.0 | 9.6 |
| Example 24 | 7.0 | 4.2 | 203 | 15.0 | 9.0 |
| Example 25 | 6.0 | 3.6 | 208 | 14.0 | 8.4 |
| Example 26 | 4.0 | 2.4 | 209 | 12.0 | 7.2 |
| Example 27 | 3.0 | 1.8 | 203 | 11.0 | 6.6 |
| Example 28 | 3.0 | 1.8 | 197 | 11.0 | 6.6 |
| Example 29 | 10.0 | 6.0 | 198 | 18 | 11 |
| Example 30 | 8 | 4.8 | 203 | 16 | 10 |

TABLE 7

| | Evaluation | | |
|---|---|---|---|
| Table 1-1-7 | ESD performance | Initial defect inhibition performance | Defect inhibition performance after 1 month of storage |
| Example 1 | A | AA | AA |
| Example 2 | A | AA | AA |
| Example 3 | A | AA | AA |
| Example 4 | A | AA | AA |
| Example 5 | A | AA | AA |
| Example 6 | A | AA | AA |
| Example 7 | A | AA | AA |
| Example 8 | A | AA | AA |
| Example 9 | A | AA | AA |
| Example 10 | A | AA | AA |
| Example 11 | A | AA | AA |
| Example 12 | A | AA | AA |
| Example 13 | A | AA | AA |
| Example 14 | A | AA | AA |
| Example 15 | A | AA | AA |
| Example 16 | A | AA | AA |
| Example 17 | A | AA | AA |
| Example 18 | A | AA | AA |
| Example 19 | A | AA | A |
| Example 20 | A | AA | AA |
| Example 21 | A | AA | C |
| Example 22 | A | AA | C |
| Example 23 | A | AA | AA |
| Example 24 | A | AA | AA |
| Example 25 | A | AA | AA |
| Example 26 | A | AA | AA |
| Example 27 | A | AA | AA |
| Example 28 | A | AA | AA |
| Example 29 | A | AA | AA |
| Example 30 | A | AA | AA |

TABLE 8

| | Preparation of chemical liquid | | | | Chemical liquid | | |
|---|---|---|---|---|---|---|---|
| | | | | | Organic solvent | Content of impurities immediately after preparation | |
| Table 1-2-1 | Preliminary washing | Filter 1 | Filter 2 | Filter 3 | Organic solvent Type | Conductivity (× $10^{-6}$ S/m) | Metal ions (Mass ppt) | Metal particles (Mass ppt) |
| Example 31 | 1 | PTFE 10 nm | PTFE 5 nm | PTFE 5 nm | CyHe | 5 | 8.0 | 4.8 |
| Example 32 | 1 | PTFE 10 nm | PTFE 5 nm | PTFE 5 nm | CyHe | 5 | 8.0 | 4.8 |
| Example 33 | 1 | PTFE 10 nm | PTFE 5 nm | PTFE 5 nm | CyHe | 5 | 8.0 | 4.8 |
| Example 34 | 1 | PTFE 10 nm | PTFE 5 nm | PTFE 5 nm | CyHe | 5 | 8.0 | 4.8 |

TABLE 8-continued

| Table 1-2-1 | Preliminary washing | Filter 1 | Filter 2 | Filter 3 | Organic solvent Type | Organic solvent Conductivity ($\times 10^{-6}$ S/m) | Metal ions (Mass ppt) | Metal particles (Mass ppt) |
|---|---|---|---|---|---|---|---|---|
| Example 35 | 1 | PTFE 10 nm | PTFE 5 nm | PTFE 5 nm | CyHe | 5 | 8.0 | 4.8 |
| Example 36 | 1 | PTFE 10 nm | PTFE 5 nm | PTFE 5 nm | CyHe | 5 | 8.0 | 4.8 |
| Example 37 | 1 | PTFE 10 nm | PTFE 5 nm | PTFE 5 nm | PGMM | 3 | 5.0 | 3.0 |
| Example 38 | 1 | PTFE 10 nm | PTFE 5 nm | PTFE 5 nm | PGME | <1 | 3.3 | 2.0 |
| Example 39 | 1 | PTFE10 nm | PTFE 5 nm | PTFE 5 nm | PGMP | <1 | 6.7 | 4.0 |
| Example 40 | 1 | PTFE 10 nm | PTFE 5 nm | PTFE 5 nm | PGMEA | <1 | 5.0 | 3.0 |
| Example 41 | 1 | PTFE 10 nm | PTFE 5 nm | PTFE 5 nm | EL | <1 | 8.3 | 5.0 |
| Example 42 | 1 | PTFE 10 nm | PTFE 5 nm | PTFE 5 nm | MPM | <1 | 3.3 | 2.0 |
| Example 43 | 1 | PTFE 10 nm | PTFE 5 nm | PTFE 5 nm | CyPn | <1 | 6.7 | 4.0 |
| Example 44 | 1 | PTFE 10 nm | PTFE 5 nm | PTFE 5 nm | CyHe | 5 | 8.3 | 5.0 |
| Example 45 | 1 | PTFE 10 nm | PTFE 5 nm | PTFE 5 nm | yBL | <1 | 3.3 | 2.0 |
| Example 46 | 1 | PTFE 10 nm | PTFE 5 nm | PTFE 5 nm | D1AE | <1 | 10.0 | 6.0 |
| Example 47 | 1 | PTFE 10 nm | PTFE 5 nm | PTFE 5 nm | nBA | 1.3 | 5.0 | 3.0 |
| Example 48 | 1 | PTFE 10 nm | PTFE 5 nm | PTFE 5 nm | iAA | <1 | 5.0 | 3.0 |
| Example 49 | 1 | PTFE 10 nm | PTFE 5 nm | PTFE 5 nm | Hexane | 1 | 6.7 | 4.0 |
| Example 50 | 1 | PTFE 10 nm | PTFE 5 nm | PTFE 5 nm | MAK | <1 | 5.0 | 3.0 |
| Example 51 | 1 | PTFE 10 nm | PTFE 5 nm | PTFE 5 nm | IPA | 6 | 3.3 | 2.0 |
| Example 52 | 1 | PTFE 10 nm | PTFE 5 nm | PTFE 5 nm | MIBC | 0.36 | 3.3 | 2.0 |
| Example 53 | 1 | PTFE 10 nm | PTFE 5 nm | PTFE 5 nm | PGMEA/PGME (v/v = 7/3) | <1 | 6.7 | 4.0 |
| Example 54 | 1 | PTFE 10 nm | PTFE 5 nm | PTFE 5 nm | CyHe | 5 | 10.0 | 6.0 |
| Example 55 | 1 | PTFE 10 nm | PTFE 5 nm | PTFE 5 nm | CyHe | 5 | 10.0 | 6.0 |
| Example 56 | 1 | PTFE 10 nm | PTFE 5 nm | | nBA | 1.3 | 6.0 | 3.6 |
| Example 57 | 1 | PTFE 20 nm | PTFE 20 nm | | nBA | 1.3 | 8.0 | 4.8 |
| Example 58 | 1 | PTFE 50 nm | PTFE 10 nm | | nBA | 1.3 | 2052.0 | 1231.2 |
| Example 59 | 1 | PTFE 50 nm | PTFE 5 nm | | nBA | 1.3 | 1563.0 | 937.8 |
| Example 60 | 1 | PTFE 5 nm | PTFE 5 nm | PTFE 5 nm | nBA | 1.3 | 0.050 | 0.030 |
| Example 61 | 1 | PTFE 5 nm | PTFE 5 nm | PTFE 5 nm | nBA | 1.3 | 0.009 | 0.005 |

TABLE 9

| Table 1-2-2 | General Formula (I) Content (Mass ppt) | Type | General Formula (II) Content (Mass ppt) | Type | General Formula (III) Content (Mass ppt) | Type | General Formula (IV) Content (Mass ppt) | Type |
|---|---|---|---|---|---|---|---|---|
| Example 31 | 80 | Compound 1-4 | 30 | Compound 8 | 14.25 | Compound 19-22 | 25 | Compound 28-33 |
| Example 32 | 80 | Compound 1-4 | 30 | Compound 8 | 16.5 | Compound 19-22 | 25 | Compound 28-33 |
| Example 33 | 80 | Compound 1-4 | 30 | Compound 8 | 12.75 | Compound 19-22 | 25 | Compound 28-33 |
| Example 34 | 80 | Compound 1-4 | 30 | Compound 8 | 12.75 | Compound 19-22 | 25 | Compound 28-33 |
| Example 35 | 80 | Compound 1-4 | 30 | Compound 8 | 12.75 | Compound 19-22 | 25 | Compound 28-33 |
| Example 36 | 80 | Compound 1-4 | 30 | Compound 8 | 12.75 | Compound 19-22 | 25 | Compound 28-33 |
| Example 37 | 77 | Compound 1-4 | 30 | Compound 8 | 18 | Compound 19-22 | | |
| Example 38 | 51 | Compound 1-4 | | | 12 | Compound 19-22 | 20 | Compound 28-33 |
| Example 39 | 102 | Compound 1-4 | 24 | Compound 8 | 20 | Compound 19-22 | | |
| Example 40 | 77 | Compound 1-4 | | | 12 | Compound 19-22 | | |
| Example 41 | 128 | Compound 1-4 | | | 24 | Compound 19-22 | 50 | Compound 28-33 |
| Example 42 | 51 | Compound 1-4 | | | 12 | Compound 19-22 | 20 | Compound 28-33 |
| Example 43 | 13 | Compound 1-4 | 24 | Compound 8-14 | 24 | Compound 19-22 | 40 | Compound 28-33 |

TABLE 9-continued

| Table 1-2-2 | Chemical liquid | | | | | | | |
|---|---|---|---|---|---|---|---|---|
| | General Formula (I) | | General Formula (II) | | General Formula (III) | | General Formula (IV) | |
| | Content (Mass ppt) | Type | Content (Mass ppt) | Type | Content (Mass ppt) | Type | Content (Mass ppt) | Type |
| Example 44 | 38 | Compound 1-4 | 48 | Compound 8-14 | 30 | Compound 19-22 | 50 | Compound 28-33 |
| Example 45 | 51 | Compound 1-4 | | | 12 | Compound 19-22 | 20 | Compound 28-33 |
| Example 46 | 154 | Compound 1-4 | 24 | Compound 8 | 18 | Compound 19-22 | 60 | Compound 28-33 |
| Example 47 | 77 | Compound 1-4 | 24 | Compound 8 | 10 | Compound 19-22 | 30 | Compound 28-33 |
| Example 48 | 77 | Compound 1-4 | | | 18 | Compound 19-22 | | |
| Example 49 | 102 | Compound 1-4 | 36 | Compound 8 | 24 | Compound 19-22 | | |
| Example 50 | 77 | Compound 1-4 | | | 18 | Compound 19-22 | 30 | Compound 28-33 |
| Example 51 | 51 | Compound 1-4 | | | 12 | Compound 19-22 | 20 | Compound 28-33 |
| Example 52 | 51 | Compound 1-4 | | | 12 | Compound 19-22 | | |
| Example 53 | 64 | Compound 1-4 | | | 12 | Compound 19-22 | | |
| Example 54 | 48 | Compound 1-4 | 48 | Compound 8-14 | 30 | Compound 19-22 | 50 | Compound 28-33 |
| Example 55 | 48 | Compound 1-4 | 48 | Compound 8-14 | 30 | Compound 19-22 | 50 | Compound 28-33 |
| Example 56 | 96 | Compound 1-4 | 36 | Compound 8 | 13.5 | Compound 19-22 | 30 | Compound 28-33 |
| Example 57 | 128 | Compound 1-4 | 48 | Compound 8 | 13.5 | Compound 19-22 | 40 | Compound 28-33 |
| Example 58 | 85 | Compound 1-4 | 32 | Compound 8 | 16 | Compound 19-22 | 27 | Compound 28-33 |
| Example 59 | 123 | Compound 1-4 | 46 | Compound 8 | 23 | Compound 19-22 | 38 | Compound 28-33 |
| Example 60 | 240 | Compound 1-4 | 90 | Compound 8 | 45 | Compound 19-22 | 75 | Compound 28-33 |
| Example 61 | 184 | Compound 1-4 | 69 | Compound 8 | 35 | Compound 19-22 | 58 | Compound 28-33 |

TABLE 10

| Table 1-2-3 | Container | | | | | | | | |
|---|---|---|---|---|---|---|---|---|---|
| | Type of polymer | | | Nannocarbon material (carbon nanotubes) | | | | | |
| | Ratio | Type | Terminal modification | Major acis (μm) | Content (Mass %) | $M_1$ | $M_2$ | $M_1/M_2$ | $M_2/A_2$ |
| Example 31 | 0.086 | PTFE | — | 100 | 0.05 | 0.05 | 0.06 | 0.9 | 1,000 |
| Example 32 | 0.084 | PTFE | — | 100 | 0.05 | 0.05 | 0.07 | 0.7 | 1,000 |
| Example 33 | 0.087 | PTFE | — | 100 | 0.05 | 0.05 | 0.06 | 0.8 | 1,000 |
| Example 34 | 0.087 | PTFE | — | 100 | 0.5 | 0.05 | 0.06 | 0.8 | 1,000 |
| Example 35 | 0.087 | PTFE | — | 100 | 0.05 | 0.05 | 0.1 | 0.5 | 1,000 |
| Example 36 | 0.087 | PTFE | — | 100 | 0.05 | 0.05 | 0.1 | 0.5 | 1,000 |
| Example 37 | 0.064 | PTFE | — | 100 | 0.05 | 0.05 | 0.1 | 0.5 | 1,000 |
| Example 38 | 0.064 | PTFE | — | 100 | 0.05 | 0.05 | 0.1 | 0.5 | 1,000 |
| Example 39 | 0.073 | PTFE | — | 100 | 0.05 | 0.05 | 0.1 | 0.5 | 1,000 |
| Example 40 | 0.090 | PTFE | — | 100 | 0.05 | 0.05 | 0.1 | 0.5 | 1,000 |
| Example 41 | 0.066 | PTFE | — | 100 | 0.05 | 0.05 | 0.1 | 0.5 | 1,000 |
| Example 42 | 0.064 | PTFE | — | 100 | 0.05 | 0.05 | 0.1 | 0.5 | 1,000 |
| Example 43 | 0.106 | PTFE | — | 100 | 0.05 | 0.05 | 0.1 | 0.5 | 1,000 |
| Example 44 | 0.080 | PTFE | — | 100 | 0.05 | 0.05 | 0.1 | 0.5 | 1,000 |
| Example 45 | 0.064 | PTFE | — | 100 | 0.05 | 0.05 | 0.1 | 0.5 | 1,000 |
| Example 46 | 0.063 | PTFE | — | 100 | 0.05 | 0.05 | 0.1 | 0.5 | 1,000 |
| Example 47 | 0.057 | PTFE | — | 100 | 0.05 | 0.05 | 0.1 | 0.5 | 1,000 |
| Example 48 | 0.084 | PTFE | — | 100 | 0.05 | 0.05 | 0.1 | 0.5 | 1,000 |
| Example 49 | 0.066 | PTFE | — | 100 | 0.05 | 0.05 | 0.1 | 0.5 | 1,000 |
| Example 50 | 0.064 | PTFE | — | 100 | 0.05 | 0.05 | 0.1 | 0.5 | 1,000 |
| Example 51 | 0.064 | PTFE | — | 100 | 0.05 | 0.05 | 0.1 | 0.5 | 1,000 |
| Example 52 | 0.084 | PTFE | — | 100 | 0.05 | 0.05 | 0.1 | 0.5 | 1,000 |
| Example 53 | 0.140 | PTFE | — | 100 | 0.05 | 0.05 | 0.1 | 0.5 | 1,000 |

TABLE 10-continued

| | | Container | | | | | | | |
|---|---|---|---|---|---|---|---|---|---|
| | | Type of polymer | | Nannocarbon material (carbon nanotubes) | | | | | |
| Table 1-2-3 | Ratio | Type | Terminal modification | Major acis (μm) | Content (Mass %) | $M_1$ | $M_2$ | $M_1/M_2$ | $M_2/A_2$ |
| Example 54 | 0.091 | PFA | — | 300 | 0.05 | 0.05 | 0.1 | 0.5 | 1,000 |
| Example 55 | 0.091 | PFA | Performed | 300 | 0.05 | 0.05 | 0.1 | 0.5 | 1,000 |
| Example 56 | 0.055 | PP | — | — | — | — | — | — | — |
| Example 57 | 0.056 | HDPE | — | — | — | — | — | — | — |
| Example 58 | 20.552 | PTFE | — | 300 | 0.05 | 0.05 | 0.1 | 0.5 | 1,000 |
| Example 59 | 10.847 | PTFE | — | 300 | 0.05 | 0.05 | 0.1 | 0.5 | 1,000 |
| Example 60 | 0.00018 | PTFE | — | 300 | 0.05 | 0.05 | 0.1 | 0.5 | 1,000 |
| Example 61 | 0.00004 | PTFE | — | 300 | 0.05 | 0.05 | 0.1 | 0.5 | 1,000 |

TABLE 11

| | Container | | | | | | |
|---|---|---|---|---|---|---|---|
| | Surfactant | | | | | | |
| Table 1-2-4 | Type | Content (Mass %) | $A_1$ (Mass %) | $A_2$ (MAss %) | $A_1/A_2$ | $X_1$ | $X_2$ |
| Example 31 | 1 | 1.0 | 0.03 | 0.03 | 0.9 | 1.5 | 1.4 |
| Example 32 | 1 | 1.0 | 0.03 | 0.04 | 0.7 | 2.8 | 2 |
| Example 33 | 1 | 1.0 | 0.03 | 0.04 | 0.8 | 0.4 | 0.3 |
| Example 34 | 1 | 1.0 | 0.03 | 0.04 | 0.8 | 3.2 | 3 |
| Example 35 | 2 | 1.0 | 0.03 | 0.30 | 0.1 | 1.9 | 1.5 |
| Example 36 | 3 | 1.0 | 0.03 | 0.30 | 0.1 | 1.9 | 1.5 |
| Example 37 | 4 | 1.0 | 0.03 | 0.30 | 0.1 | 1.9 | 1.5 |
| Example 38 | 1 | 1.0 | 0.03 | 0.30 | 0.1 | 1.9 | 1.5 |
| Example 39 | 1 | 1.0 | 0.03 | 0.30 | 0.1 | 1.9 | 1.5 |
| Example 40 | 1 | 1.0 | 0.03 | 0.30 | 0.1 | 1.9 | 1.5 |
| Example 41 | 1 | 1.0 | 0.03 | 0.30 | 0.1 | 1.9 | 1.5 |
| Example 42 | 1 | 1.0 | 0.03 | 0.30 | 0.1 | 1.9 | 1.5 |
| Example 43 | 1 | 1.0 | 0.03 | 0.30 | 0.1 | 1.9 | 1.5 |
| Example 44 | 1 | 1.0 | 0.03 | 0.30 | 0.1 | 1.9 | 1.5 |
| Example 45 | 1 | 1.0 | 0.03 | 0.30 | 0.1 | 1.9 | 1.5 |
| Example 46 | 1 | 1.0 | 0.03 | 0.30 | 0.1 | 1.9 | 1.5 |
| Example 47 | 1 | 1.0 | 0.03 | 0.30 | 0.1 | 1.9 | 1.5 |
| Example 48 | 1 | 1.0 | 0.03 | 0.30 | 0.1 | 1.9 | 1.5 |
| Example 49 | 1 | 1.0 | 0.03 | 0.30 | 0.1 | 1.9 | 1.5 |
| Example 50 | 1 | 1.0 | 0.03 | 0.30 | 0.1 | 1.9 | 1.5 |
| Example 51 | 1 | 1.0 | 0.03 | 0.30 | 0.1 | 1.9 | 1.5 |
| Example 52 | 1 | 1.0 | 0.03 | 0.30 | 0.1 | 1.9 | 1.5 |
| Example 53 | 1 | 1.0 | 0.03 | 0.30 | 0.1 | 1.9 | 1.5 |
| Example 54 | 1 | 1.0 | 0.03 | 0.30 | 0.1 | 1.75 | 1.6 |
| Example 55 | 1 | 1.0 | 0.03 | 0.30 | 0.1 | 1.9 | 1.6 |
| Example 56 | — | — | — | — | — | — | — |
| Example 57 | — | — | — | — | — | — | — |
| Example 58 | 1 | 1.0 | 0.03 | 0.30 | 0.1 | 1.9 | 1.5 |
| Example 59 | 1 | 1.0 | 0.03 | 0.30 | 0.1 | 1.9 | 1.5 |
| Example 60 | 1 | 1.0 | 0.03 | 0.30 | 0.1 | 1.9 | 1.5 |
| Example 61 | 1 | 1.0 | 0.03 | 0.30 | 0.1 | 1.9 | 1.5 |

TABLE 12

| | Container | | | |
|---|---|---|---|---|
| | Molding method | | | |
| Table 1-2-5 | Type | Mold temperature (° C.) | Heating treatment temperature (° C.) | Cooling temperature (° C.) |
| Example 31 | 1 | 200 | 380 | 100 |
| Example 32 | 1 | 100 | 380 | 100 |
| Example 33 | 1 | 150 | 380 | 100 |
| Example 34 | 1 | 250 | 380 | 100 |
| Example 35 | 1 | 150 | 380 | 100 |
| Example 36 | 1 | 150 | 380 | 100 |
| Example 37 | 1 | 150 | 380 | 100 |
| Example 38 | 2 | 150 | 380 | 100 |
| Example 39 | 2 | 150 | 380 | 100 |
| Example 40 | 2 | 150 | 380 | 100 |
| Example 41 | 2 | 150 | 380 | 100 |
| Example 42 | 2 | 150 | 380 | 100 |
| Example 43 | 2 | 150 | 380 | 100 |
| Example 44 | 2 | 150 | 380 | 100 |
| Example 45 | 2 | 150 | 380 | 100 |
| Example 46 | 2 | 150 | 380 | 100 |
| Example 47 | 2 | 150 | 380 | 100 |
| Example 48 | 2 | 150 | 380 | 100 |
| Example 49 | 2 | 150 | 380 | 100 |
| Example 50 | 2 | 150 | 380 | 100 |
| Example 51 | 2 | 150 | 380 | 100 |
| Example 52 | 2 | 150 | 380 | 100 |
| Example 53 | 2 | 150 | 380 | 100 |
| Example 54 | 1 | 150 | 380 | 100 |
| Example 55 | 1 | 150 | 380 | 100 |
| Example 56 | — | — | — | — |
| Example 57 | — | — | — | — |
| Example 58 | 1 | 150 | 380 | 100 |
| Example 59 | 1 | 150 | 380 | 100 |
| Example 60 | 1 | 150 | 380 | 100 |
| Example 61 | 1 | 150 | 380 | 100 |

TABLE 13

| | Container | | | | |
|---|---|---|---|---|---|
| | Elution test: increase in impurities before and after immersion | | | Content of impurities in chemical liquid after elapse of time | |
| Table 1-2-6 | Metal ions (Mass ppt) | Metal particles (Mass ppt) | Organic impurities (Mass ppt) | Metal ions (Mass ppt) | Metal particles (Mass ppt) |
| Example 31 | 15.0 | 9.0 | 199 | 23.0 | 13.8 |
| Example 32 | 8.0 | 4.8 | 202 | 16.0 | 9.6 |
| Example 33 | 2500.0 | 1500.0 | 198 | 2508.0 | 1504.8 |
| Example 34 | 15000.0 | 9000.0 | 198 | 15008.0 | 9004.8 |
| Example 35 | 5.0 | 3.0 | 198 | 13.0 | 7.8 |
| Example 36 | 5.0 | 3.0 | 198 | 13.0 | 7.8 |
| Example 37 | 5.0 | 3.0 | 175 | 13.0 | 7.8 |
| Example 38 | 3.0 | 1.8 | 133 | 9.0 | 5.4 |
| Example 39 | 2.0 | 1.2 | 196 | 6.0 | 3.6 |
| Example 40 | 4.0 | 2.4 | 139 | 12.0 | 7.2 |
| Example 41 | 3.0 | 1.8 | 252 | 9.0 | 5.4 |
| Example 42 | 5.0 | 3.0 | 133 | 15.0 | 9.0 |

TABLE 13-continued

| Table 1-2-6 | Container | | | | |
|---|---|---|---|---|---|
| | Elution test: increase in impurities before and after immersion | | | Content of impurities in chemical liquid after elapse of time | |
| | Metal ions (Mass ppt) | Metal particles (Mass ppt) | Organic impurities (Mass ppt) | Metal ions (Mass ppt) | Metal particles (Mass ppt) |
| Example 43 | 2.0 | 1.2 | 131 | 6.0 | 3.6 |
| Example 44 | 4.0 | 2.4 | 206 | 12.0 | 7.2 |
| Example 45 | 5.0 | 3.0 | 163 | 15.0 | 9.0 |
| Example 46 | 2.0 | 1.2 | 266 | 6.0 | 3.6 |
| Example 47 | 6.0 | 3.6 | 221 | 18.0 | 10.8 |
| Example 48 | 3.0 | 1.8 | 175 | 9.0 | 5.4 |
| Example 49 | 3.0 | 1.8 | 212 | 9.0 | 5.4 |
| Example 50 | 4.0 | 2.4 | 175 | 12.0 | 7.2 |
| Example 51 | 3.0 | 1.8 | 133 | 9.0 | 5.4 |
| Example 52 | 2.0 | 1.2 | 113 | 6.0 | 3.6 |
| Example 53 | 2.0 | 1.2 | 126 | 6.0 | 3.6 |
| Example 54 | 10.0 | 6.0 | 226 | 18.0 | 10.8 |
| Example 55 | 10.0 | 6.0 | 226 | 18.0 | 10.8 |
| Example 56 | 2156.0 | 1293.6 | 226 | 2162.0 | 1297.2 |
| Example 57 | 3110.0 | 1866.0 | 280 | 3118.0 | 1870.8 |
| Example 58 | 10.0 | 6.0 | 210 | 2062.0 | 1237.2 |
| Example 59 | 10.0 | 6.0 | 281 | 1573.0 | 943.8 |
| Example 60 | 10.0 | 6.0 | 500 | 10.1 | 6.0 |
| Example 61 | 10.0 | 6.0 | 395 | 10.0 | 6.0 |

TABLE 14

| Table 1-2-7 | Evaluation | | |
|---|---|---|---|
| | ESD performance | Initial defect inhibition performance | Defect inhibition performance after 1 month of storage |
| Example 31 | A | AA | AA |
| Example 32 | A | AA | AA |
| Example 33 | A | AA | C |
| Example 34 | A | AA | C |
| Example 35 | A | AA | AA |
| Example 36 | A | AA | AA |
| Example 37 | A | AA | AA |
| Example 38 | A | AA | AA |
| Example 39 | A | AA | AA |
| Example 40 | A | AA | AA |
| Example 41 | A | AA | AA |
| Example 42 | A | AA | AA |
| Example 43 | A | AA | AA |
| Example 44 | A | AA | AA |
| Example 45 | A | AA | AA |
| Example 46 | A | AA | AA |
| Example 47 | A | AA | AA |
| Example 48 | A | AA | AA |
| Example 49 | A | AA | AA |
| Example 50 | A | AA | AA |
| Example 51 | A | AA | AA |
| Example 52 | A | AA | AA |
| Example 53 | A | AA | AA |
| Example 54 | A | AA | A |
| Example 55 | A | AA | A |
| Example 56 | C | AA | C |
| Example 57 | C | AA | C |
| Example 58 | A | C | C |
| Example 59 | A | C | C |
| Example 60 | A | AA | AA |
| Example 61 | A | AA | AA |

TABLE 15

| Table 1-3-1 | Preparation of chemical liquid | | | | Chemical liquid | | | |
|---|---|---|---|---|---|---|---|---|
| | Preliminary washing | Filter 1 | Filter 2 | Filter 3 | Organic solventType | Organic solvent Conductivity ($\times 10^{-6}$ S/m) | Content of impurities immediately after preparation | |
| | | | | | | | Metal ions (Mass ppt) | Metal particles (Mass ppt) |
| Example 62 | 1 | PTFE 50 nm | PTFE 10 nm | | CyHe | 5 | 2011.0 | 1206.6 |
| Example 63 | 1 | PTFE 50 nm | PTFE 5 nm | | CyHe | 5 | 1531.7 | 919.0 |
| Example 64 | 1 | PTFE 5 nm | PTFE 5 nm | PTFE 5 nm | CyHe | 5 | 0.049 | 0.029 |
| Example 65 | 1 | PTFE 5 nm | PTFE 5 nm | PTFE 5 nm | CyHe | 5 | 0.009 | 0.005 |
| Example 66 | 2 | PTFE 5 nm | PTFE 5 nm | | CyHe | 5 | 4.9 | 2.9 |
| Example 67 | 3 | PTFE 5 nm | PTFE 5 nm | | CyHe | 5 | 9.8 | 5.9 |
| Example 68 | 4 | PTFE 5 nm | PTFE 5 nm | | CyHe | 5 | 7.4 | 4.4 |
| Example 69 | 5 | PTFE 5 nm | PTFE 5 nm | | CyHe | 5 | 9.3 | 5.6 |
| Example 70 | 6 | PTFE 5 nm | PTFE 5 nm | | CyHe | 5 | 4.9 | 2.9 |
| Example 71 | 7 | PTFE 5 nm | PTFE 5 nm | | CyHe | 5 | 9.8 | 5.9 |
| Example 72 | 8 | PTFE 5 nm | PTFE 10 nm | | CyHe | 5 | 2.5 | 1.0 |
| Example 73 | 1 | PTFE 20 nm | PTFE 10 nm | | CyHe | 5 | 12.3 | 7.4 |
| Example 74 | 1 | PTFE 20 nm | PTFE 10 nm | | nBA | 1.3 | 5.7 | 3.4 |
| Example 75 | 2 | PTFE 5 nm | PTFE 5 nm | | nBA | 1.3 | 5.0 | 3.0 |

TABLE 15-continued

| Table 1-3-1 | Preparation of chemical liquid | | | | Chemical liquid | | | |
|---|---|---|---|---|---|---|---|---|
| | | | | | Organic solvent | | Content of impurities immediately after preparation | |
| | Preliminary washing | Filter 1 | Filter 2 | Filter 3 | Organic solventType | Conductivity ($\times 10^{-6}$ S/m) | Metal ions (Mass ppt) | Metal particles (Mass ppt) |
| Example 76 | 3 | PTFE 5 nm | PTFE 5 nm | | nBA | 1.3 | 10.0 | 6.0 |
| Example 77 | 4 | PTFE 5 nm | PTFE 5 nm | | nBA | 1.3 | 7.,5 | 4.5 |
| Example 78 | 5 | PTFE 5 nm | PTFE 5 nm | | nBA | 1.3 | 9.5 | 5.7 |
| Example 79 | 6 | PTFE 5 nm | PTFE 5 nm | | nBA | 1.3 | 5.0 | 3.0 |
| Example 80 | 7 | PTFE 5 nm | PTFE 5 nm | | nBA | 1.3 | 10.0 | 6.0 |
| Example 81 | 8 | PTFE 5 nm | PTFE 5 nm | | nBA | 1.3 | 2.5 | 1.0 |
| Comparative Example 1 | 3 → 1 | PTFE 10 nm | PTFE 5 nm | | CyHe | 5 | 4.0 | 2.4 |
| Comparative Example 2 | N/A | PTFE 10 nm | PTFE 5 nm | | CyHe | 5 | 4.0 | 2.4 |
| Comparative Example 3 | N/A | PTFE 10 nm | PTFE 5 nm | PTFE 5 nm | nBA | 1.3 | 8.0 | 4.8 |
| Comparative Example 4 | 3 → 1 | PTFE 10 nm | PTFE 5 nm | | nBA | 1.3 | 8.0 | 4.8 |

TABLE 16

| Table 1-3-2 | Chemical liquid | | | | | | | |
|---|---|---|---|---|---|---|---|---|
| | General Formula (I) | | General Formula (II) | | General Formula (III) | | General Formula (IV) | |
| | Content (Mass ppt) | Type | Content (Mass ppt) | Type | Content (Mass ppt) | Type | Content (Mass ppt) | Type |
| Example 62 | 48 | Compound 1-4 | 75 | Compound 8-14 | 38 | Compound 19-22 | 63 | Compound 28-33 |
| Example 63 | 80 | Compound 1-4 | 75 | Compound 8-14 | 38 | Compound 19-22 | 63 | Compound 28-33 |
| Example 64 | 156 | Compound 1-4 | 59 | Compound 8-14 | 29 | Compound 19-22 | 49 | Compound 28-33 |
| Example 65 | 120 | Compound 1-4 | 45 | Compound 8-14 | 22 | Compound 19-22 | 37 | Compound 28-33 |
| Example 66 | 1,851.2 | Compound 1-4 | 69.42 | Compound 8-14 | 92.56 | Compound 19-22 | 57.85 | Compound 28-33 |
| Example 67 | 8,112 | Compound 1-4 | 304.2 | Compound 8-14 | 405.6 | Compound 19-22 | 253.5 | Compound 28-33 |
| Example 68 | 51,896 | Compound 1-4 | 1946.1 | Compound 8-14 | 2594.8 | Compound 19-22 | 1621.75 | Compound 28-33 |
| Example 69 | 0.2 | Compound 1-4 | 0.25 | Compound 8-14 | 0.14 | Compound 19-22 | 0.08 | Compound 28-33 |
| Example 70 | 780 | Compound 1-4 | 6942 | Compound 8-14 | 9,256 | Compound 19-22 | 5785 | Compound 28-33 |
| Example 71 | 8,127 | Compound 1-4 | 30.420 | Compound 8-14 | 40.560 | Compound 19-22 | 25350 | Compound 28-33 |
| Example 72 | 30,815 | Compound 1-4 | 81,120 | Compound 8-14 | 81,120 | Compound 19-22 | 87204 | Compound 28-33 |
| Example 73 | 52 | Compound 1-4 | 19.5 | Compound 8-14 | 9.75 | Compound 19-22 | 16.25 | Compound 28-33 |
| Example 74 | 16 | Compound 1-4 | 6 | Compound 8 | 8 | Compound 19-22 | 5 | Compound 28-33 |
| Example 75 | 2,848 | Compound 1-4 | 106.8 | Compound 8 | 142.4 | Compound 19-22 | 89 | Compound 28-33 |
| Example 76 | 12,480 | Compound 1-4 | 468 | Compound 8 | 624 | Compound 19-22 | 390 | Compound 28-33 |
| Example 77 | 79,840 | Compound 1-4 | 2,994 | Compound 8 | 3,992 | Compound 19-22 | 2495 | Compound 28-33 |
| Example 78 | 0.15 | Compound 1-4 | 0.08 | Compound 8 | 0.14 | Compound 19-22 | 0.12 | Compound 28-33 |
| Example 79 | 1,200 | Compound 1-4 | 10,680 | Compound 8 | 14,240 | Compound 19-22 | 8900 | Compound 28-33 |
| Example 80 | 12,504 | Compound 1-4 | 46.800 | Compound 8 | 62,400 | Compound 19-22 | 39000 | Compound 28-33 |

TABLE 16-continued

| Table 1-3-2 | Chemical liquid | | | | | | | |
|---|---|---|---|---|---|---|---|---|
| | General Formula (I) | | General Formula (II) | | General Formula (III) | | General Formula (IV) | |
| | Content (Mass ppt) | Type | Content (Mass ppt) | Type | Content (Mass ppt) | Type | Content (Mass ppt) | Type |
| Example 81 | 47,408 | Compound 1-4 | 124,800 | Compound 8 | 124,800 | Compound 19-22 | 134160 | Compound 28-33 |
| Comparative Example 1 | 0.008 | Compound 1-4 | 0.003 | Compound 8-14 | 2,450,000 | Compound 19-22 | 765625 | Compound 28-33 |
| Comparative Example 2 | 215,000 | Compound 1-4 | 189,000 | Compound 8-14 | 154,300 | Compound 19-22 | 298750 | Compound 28-33 |
| Comparative Example 3 | 187,000 | Compound 1-4 | 70,125 | Compound 8 | 13,148 | Compound 19-22 | 4109 | Compound 28-33 |
| Comparative Example 4 | 0.006 | Compound 1-4 | 18 | Compound 8 | 3,130,000 | Compound 19-22 | 15 | Compound 28-33 |

TABLE 17

| Table 1-3-3 | Ratio | Container | | | | | | | |
|---|---|---|---|---|---|---|---|---|---|
| | | Type of polymer | | Nannocarbon material (carbon nanotubes) | | | | | |
| | | Type | Terminal modification | Major axis (μm) | Content (Mass %) | $M_1$ | $M_2$ | $M_1/M_2$ | $M_2/A_2$ |
| Example 62 | 14.428 | PTFE | — | 300 | 0.05 | 0.05 | 0.1 | 0.5 | 1,000 |
| Example 63 | 9.614 | PTFE | — | 300 | 0.05 | 0.05 | 0.1 | 0.5 | 1,000 |
| Example 64 | 0.00027 | PTFE | — | 300 | 0.05 | 0.05 | 0.1 | 0.5 | 1,000 |
| Example 65 | 0.00006 | PTFE | — | 300 | 0.05 | 0.05 | 0.1 | 0.5 | 1,000 |
| Example 66 | 0.0038 | PTFE | — | 100 | 0.001 | 0.08 | 0.16 | 0.5 | 1,000 |
| Example 67 | 0.0017 | PTFE | — | 100 | 0.001 | 0.08 | 0.16 | 0.5 | 1,000 |
| Example 68 | 0.0002 | PTFE | — | 100 | 0.001 | 0.08 | 0.16 | 0.5 | 1,000 |
| Example 69 | 22.2328 | PTFE | — | 100 | 0.001 | 0.08 | 0.16 | 0.5 | 1,000 |
| Example 70 | 0.00034 | PTFE | — | 100 | 0.001 | 0.08 | 0.16 | 0.5 | 1,000 |
| Example 71 | 0.00015 | PTFE | — | 100 | 0.001 | 0.08 | 0.16 | 0.5 | 1,000 |
| Example 72 | 0.000012 | PTFE | — | 100 | 0.001 | 0.08 | 0.16 | 0.5 | 1,000 |
| Example 73 | 0.202 | PTFE | — | 100 | 0.5 | 0.15 | 0.3 | 0.5 | 1,000 |
| Example 74 | 0.2606 | PTFE | — | 100 | 0.001 | 0.08 | 0.16 | 0.5 | 1,000 |
| Example 75 | 0.0025 | PTFE | — | 100 | 0.001 | 0.08 | 0.16 | 0.5 | 1,000 |
| Example 76 | 0.0011 | PTFE | — | 100 | 0.001 | 0.08 | 0.16 | 0.5 | 1,000 |
| Example 77 | 0.0001 | PTFE | — | 100 | 0.001 | 0.08 | 0.16 | 0.5 | 1,000 |
| Example 78 | 31.0204 | PTFE | — | 100 | 0.001 | 0.08 | 0.16 | 0.5 | 1,000 |
| Example 79 | 0.00023 | PTFE | — | 100 | 0.001 | 0.08 | 0.16 | 0.5 | 1,000 |
| Example 80 | 0.00010 | PTFE | — | 100 | 0.001 | 0.08 | 0.16 | 0.5 | 1,000 |
| Example 81 | 0.000008 | PTFE | — | 100 | 0.001 | 0.08 | 0.16 | 0.5 | 1,000 |
| Comparative Example 1 | 0.0000020 | PFA | — | 300 | 0.05 | 0.05 | 0.1 | 0.5 | 1,000 |
| Comparative Example 2 | 0.000007 | PFA | Performed | 300 | 0.1 | 0.05 | 0.1 | 0.5 | 1,000 |
| Comparative Example 3 | 0.0000467 | PTFE | — | 50 | 0.001 | 0.001 | 0.002 | 0.5 | 1,000 |
| Comparative Example 4 | 0.0000041 | PTFE | — | 50 | 1.0 | 0.8 | 1.6 | 0.5 | 1,000 |

TABLE 18

| Table 1-3-4 | Container | | | | | | |
|---|---|---|---|---|---|---|---|
| | Surfactant | | | | | F/C | |
| | Type | Content (Mass %) | $A_1$ (Mass %) | $A_2$ (Mass %) | $A_1/A_2$ | $X_1$ | $X_2$ |
| Example 62 | 1 | 1.0 | 0.03 | 0.30 | 0.1 | 1.9 | 1.5 |
| Example 63 | 1 | 1.0 | 0.03 | 0.30 | 0.1 | 1.9 | 1.5 |
| Example 64 | 1 | 1.0 | 0.03 | 0.30 | 0.1 | 1.9 | 1.5 |
| Example 65 | 1 | 1.0 | 0.03 | 0.30 | 0.1 | 1.9 | 1.5 |
| Example 66 | 1 | 1.0 | 0.03 | 0.30 | 0.1 | 1.9 | 0.9 |
| Example 67 | 1 | 1.0 | 0.03 | 0.30 | 0.1 | 1.9 | 0.9 |
| Example 68 | 1 | 1.0 | 0.03 | 0.30 | 0.1 | 1.9 | 0.9 |
| Example 69 | 1 | 1.0 | 0.03 | 0.30 | 0.1 | 1.9 | 0.9 |
| Example 70 | 1 | 1.0 | 0.03 | 0.30 | 0.1 | 1.9 | 0.9 |
| Example 71 | 1 | 1.0 | 0.03 | 0.30 | 0.1 | 1.9 | 0.9 |

TABLE 18-continued

| | | Container | | | | | |
|---|---|---|---|---|---|---|---|
| | | Surfactant | | | | | |
| | | Content | $A_1$ | $A_2$ | | F/C | |
| Table 1-3-4 | Type | (Mass %) | (Mass %) | (Mass %) | $A_1/A_2$ | $X_1$ | $X_2$ |
| Example 72 | 1 | 1.0 | 0.03 | 0.30 | 0.1 | 1.9 | 0.9 |
| Example 73 | 1 | 1.0 | 0.03 | 0.30 | 0.1 | 1.85 | 1.7 |
| Example 74 | 1 | 1.0 | 0.03 | 0.30 | 0.1 | 1.9 | 0.9 |
| Example 75 | 1 | 1.0 | 0.03 | 0.30 | 0.1 | 1.9 | 0.9 |
| Example 76 | 1 | 1.0 | 0.03 | 0.30 | 0.1 | 1.9 | 0.9 |
| Example 77 | 1 | 1.0 | 0.03 | 0.30 | 0.1 | 1.9 | 0.9 |
| Example 78 | 1 | 1.0 | 0.03 | 0.30 | 0.1 | 1.9 | 0.9 |
| Example 79 | 1 | 1.0 | 0.03 | 0.30 | 0.1 | 1.9 | 0.9 |
| Example 80 | 1 | 1.0 | 0.03 | 0.30 | 0.1 | 1.9 | 0.9 |
| Example 81 | 1 | 1.0 | 0.03 | 0.30 | 0.1 | 1.9 | 0.9 |
| Comparative Example 1 | 1 | 1.0 | 0.03 | 0.30 | 0.1 | 1.75 | 1.6 |
| Comparative Example 2 | 1 | 1.0 | 0.03 | 0.30 | 0.1 | 1.9 | 1.6 |
| Comparative Example 3 | 1 | 1.0 | 0.03 | 0.30 | 0.1 | 0.2 | 0.2 |
| Comparative Example 4 | 1 | 1.0 | 0.03 | 0.30 | 0.1 | 3.5 | 3.5 |

TABLE 19

| | | Container Molding method | | |
|---|---|---|---|---|
| Table 1-3-5 | Type | Mold temperature (° C.) | Heating treatment temperature (° C.) | Cooling temperature (° C.) |
| Example 62 | 1 | 150 | 380 | 100 |
| Example 63 | 1 | 150 | 380 | 100 |
| Example 64 | 1 | 150 | 380 | 100 |
| Example 65 | 1 | 150 | 380 | 100 |
| Example 66 | 1 | 150 | 350 | 100 |
| Example 67 | 1 | 150 | 300 | 100 |
| Example 68 | 1 | 150 | 280 | 100 |
| Example 69 | 1 | 150 | 380 | 100 |
| Example 70 | 1 | 150 | 350 | 100 |
| Example 71 | 1 | 150 | 300 | 100 |
| Example 72 | 1 | 150 | 280 | 100 |
| Example 73 | 1 | 150 | 380 | 100 |
| Example 74 | 1 | 150 | 380 | 100 |
| Example 75 | 1 | 150 | 350 | 100 |
| Example 76 | 1 | 150 | 300 | 100 |
| Example 77 | 1 | 150 | 280 | 100 |
| Example 78 | 1 | 150 | 380 | 100 |
| Example 79 | 1 | 150 | 350 | 100 |
| Example 80 | 1 | 150 | 300 | 100 |
| Example 81 | 1 | 150 | 280 | 100 |
| Comparative Example 1 | 1 | 150 | 380 | 100 |
| Comparative Example 2 | 1 | 150 | 380 | 100 |
| Comparative Example 3 | 1 | 150 | 380 | 100 |
| Comparative Example 4 | 1 | 150 | 380 | 100 |

TABLE 20

| | Container | | | | |
|---|---|---|---|---|---|
| | Elution test: increase in impurities before and after immersion | | | Content of impurities in chemical liquid after elapse of time | |
| Table 1-3-6 | Metal ions (Mass ppt) | Metal particles (Mass ppt) | Organic impurities (Mass ppt) | Metal ions (Mass ppt) | Metal particles (Mass ppt) |
| Example 62 | 10.0 | 6.0 | 273 | 2,021.0 | 1,212.6 |
| Example 63 | 10.0 | 6.0 | 305 | 1,541.7 | 925.0 |
| Example 64 | 10.0 | 6.0 | 343 | 10.0 | 6.0 |
| Example 65 | 10.0 | 6.0 | 274 | 10.0 | 6.0 |
| Example 66 | 1.0 | 0.6 | 2,121 | 5.9 | 3.5 |
| Example 67 | 1.0 | 0.6 | 9,125 | 10.8 | 6.5 |
| Example 68 | 1.0 | 0.6 | 58,109 | 8.4 | 5.0 |
| Example 69 | 1.0 | 0.6 | 51 | 10.3 | 6.2 |
| Example 70 | 1.0 | 0.6 | 22,813 | 5.9 | 3.5 |
| Example 71 | 1.0 | 0.6 | 104,507 | 10.8 | 6.5 |
| Example 72 | 1.0 | 0.6 | 280,309 | 3.5 | 1.6 |
| Example 73 | 180.0 | 108.0 | 148 | 192 | 115 |
| Example 74 | 1.0 | 0.6 | 85 | 6.7 | 4.0 |
| Example 75 | 1.0 | 0.6 | 3,236 | 6.0 | 3.6 |
| Example 76 | 1.0 | 0.6 | 14,012 | 11.0 | 6.6 |
| Example 77 | 1.0 | 0.6 | 89,371 | 8.5 | 5.1 |
| Example 78 | 1.0 | 0.6 | 50 | 10.5 | 6.3 |
| Example 79 | 1.0 | 0.6 | 35,070 | 6.0 | 3.6 |
| Example 80 | 1.0 | 0.6 | 160,754 | 11.0 | 6.6 |
| Example 81 | 1.0 | 0.6 | 431,218 | 3.5 | 1.6 |
| Comparative Example 1 | 10 | 6.0 | 3,215,675 | 18.0 | 10.8 |
| Comparative Example 2 | 10 | 6.0 | 957,100 | 18.0 | 10.8 |
| Comparative Example 3 | 1,500 | 900.0 | 274,432 | 1,508.0 | 904.8 |
| Comparative Example 4 | 165,000 | 99000.0 | 3,130,083 | 165,008.0 | 99,004.8 |

TABLE 21

| | Evaluation | | |
|---|---|---|---|
| Table 1-3-7 | ESD performance | Initial defect inhibition performance | Defect inhibition performance after 1 month of storage |
| Example 62 | A | C | C |
| Example 63 | A | C | C |
| Example 64 | A | AA | AA |
| Example 65 | A | AA | AA |
| Example 66 | A | B | B |
| Example 67 | A | C | C |
| Example 68 | A | D | D |
| Example 69 | A | AA | AA |
| Example 70 | A | B | D |
| Example 71 | A | D | D |
| Example 72 | A | D | D |
| Example 73 | AA | AA | AA |
| Example 74 | A | AA | AA |
| Example 75 | A | B | B |
| Example 76 | A | C | C |
| Example 77 | A | D | D |
| Example 78 | A | AA | AA |
| Example 79 | A | B | C |
| Example 80 | A | D | D |
| Example 81 | A | D | D |
| Comparative Example 1 | E | E | E |
| Comparative Example 2 | AA | E | E |
| Comparative Example 3 | D | E | E |
| Comparative Example 4 | AA | E | E |

The data relating to each of the examples and the comparative examples is listed in each line in Table 1-1-1 to 1-1-7, Table 1-2-1 to 1-2-7, and Table 1-3-1 to 1-3-7. For example, in Example 1, PGMM was used as an organic solvent as shown in Table 1-1-1, the content of the compound represented by General Formula (I) in the chemical liquid was 96 mass ppt as shown in Table 1-1-2, the major axis of the nanocarbon material used for preparing the container was 100 μm as shown in Table 1-1-3, the type of the surfactant used for preparing the container was "1" as shown in Table 1-1-4, the type of the container molding method was "1" as shown in Table 1-1-5, "Elution test: content of impurities before and after immersion" in the container was 3.0 mass ppt as shown in Table 1-1-6, and the ESD performance was "A" as shown in Table 1-1-7. For other examples and comparative examples, the data can be read in the same manner.

By comparing Examples 66 to 81 with one another, it has been found that the content of the compound represented by General Formula (I) is preferably 0.1 to 50,000 mass ppt, and more preferably 0.1 to 5,000 mass ppt. Furthermore, the content of the compounds represented by General Formula (II) to General Formula (IV) is preferably 0.01 to 50,000 mass ppt.

As is evident from the results shown in Table 1, even after 1 month of storage, the chemical liquid storage body of Example 1, in which the major axis of the carbon nanotubes was 0.01 to 1,000 μm, maintained the defect inhibition performance of the chemical liquid in a better state, compared to the chemical liquid storage body of Example 19.

Furthermore, as is evident from the results shown in Table 1, even after 1 month of storage, the chemical liquid storage body of Example 1, in which the content of the surfactant with respect to the total mass of the composition was 0.001% to 0.5% by mass, maintained the defect inhibition performance of the chemical liquid in a better state, compared to the chemical liquid storage body of Example 23.

In addition, as is evident from the results shown in Table 1, the chemical liquid storage body of Example 1 in which $X_1$ was 0.50 to 3.0 had better ESD performance compared to the chemical liquid storage body of Example 34. Moreover, even after 1 month of storage, the chemical liquid storage body of Example 1 maintained defect inhibition performance of the chemical liquid in a better state compared to the chemical liquid storage body of Example 34.

EXPLANATION OF REFERENCES 10, 20: Container with lid
11: container
12: lid
13: mouth
14: lateral portion
15: inner wall surface
16: outer wall surface
21: base material
22: coating layer
23: outer surface

What is claimed is:
1. A chemical liquid comprising:
an organic solvent that has a conductivity equal to or lower than $10^{-5}$ S/m at 25° C.; and
a compound represented by General Formula (I),
wherein a content of the compound represented by General Formula (I) with respect to the total mass of the chemical liquid is 0.10 mass ppt to 100,000 mass ppt,

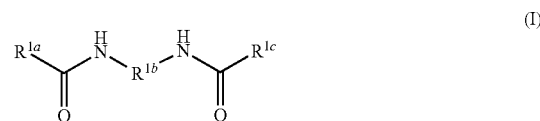

in General Formula (I), $R^{1a}$ and $R^{1c}$ each independently represent an alkyl group which may have a substituent, and $R^{1b}$ represents an alkylene group which may have a substituent.

2. The chemical liquid according to claim 1,
wherein a boiling point of the compound represented by General Formula (I) is equal to or higher than 300° C.

3. The chemical liquid according to claim 1, comprising:
two or more of the compound represented by General Formula (I).

4. The chemical liquid according to claim 1, further comprising:
at least one organic compound selected from the group consisting of compounds represented by General Formula (II) to General Formula (IV),

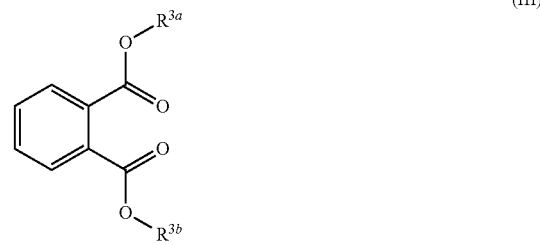

in General Formula (II), $R^{2a}$ represents an alkyl group which may have a substituent or a hydrogen atom,
$R^{2b}$ and $R^{2c}$ each independently represent a hydrogen atom, -AL-O—$R^{2d}$, —CO—$R^{2e}$, or —CH(OH)—$R^{2f}$,
AL represents an alkylene group which may have a substituent,
$R^{2d}$, $R^{2e}$, and $R^{2f}$ each independently represent a substituent,
in a case where there is a plurality of $R^{2d}$'s, the plurality of $R^{2d}$'s may be the same as or different from each other, in a case where there is a plurality of $R^{2e}$'s, the plurality of $R^{2e}$'s may be the same as or different from each other, in a case where there is a plurality of $R^{2f}$'s, the plurality of $R^{2f}$'s may be the same as or different from each other,
a combination of two groups selected from the group consisting of $R^{2a}$, $R^{2d}$, $R^{2e}$, and $R^{2f}$, two $R^{2d}$'s, two $R^{2e}$'s, or two $R^{2f}$'s may form a ring by being bonded to each other,
at least one of $R^{2a}$, $R^{2b}$, or $R^{2c}$ is not a hydrogen atom,
in General Formula (III), $R^{3a}$ and $R^{3b}$ each independently represent an alkyl group which may have a substituent, and in General Formula (IV), $R^{4a}$ to $R^{4c}$ each independently represent a hydrogen atom, an alkyl group which may have a substituent, or a benzene ring group which may have a substituent.

5. The chemical liquid according to claim 4, wherein the total content of the organic compound with respect to the total mass of the chemical liquid is 0.1 mass ppt to 100,000 mass ppt.

6. The chemical liquid according to claim 1, further comprising:
 metal components,
 wherein a content of the metal components with respect to the total mass of the chemical liquid is 0.01 to 500 mass ppt.

7. The chemical liquid according to claim 4, further comprising:
 metal components,
 wherein a ratio of the total content of the compounds represented by General Formula (I) to General Formula (IV) to a content of the metal components is 0.00001 to 10.

8. The chemical liquid according to claim 1, wherein the organic solvent is at least one compound selected from the group consisting of butyl acetate, isoamyl acetate, and 4-methyl-2-pentanol.

9. A chemical liquid storage body comprising:
 a container; and
 the chemical liquid according to claim 1 that is stored in the container.

10. The chemical liquid storage body according to claim 9,
 wherein the container contains at least one component selected from the group consisting of polyethylene, polypropylene, and a polymer containing fluorine atoms.

11. The chemical liquid storage body according to claim 9,
 wherein the container contains a polymer containing fluorine atoms,
 an atom number ratio $X_1$ of the number of fluorine atoms contained in at least a surface of a portion of the container to the number of carbon atoms contained in the surface is 0.50 to 3.0,
 an atom number ratio $X_2$ of the number of fluorine atoms contained in a position 10 nm below the surface in a thickness direction of the container to the number of carbon atoms contained in the position satisfies $X_1 > X_2$, and
 $X_1$ and $X_2$ are measured by time-of-flight secondary ion mass spectrometry.

12. The chemical liquid storage body according to claim 10,
 wherein the polymer containing fluorine atoms is at least one compound selected from the group consisting of polytetrafluoroethylene, perfluoroalkoxyalkane, a tetrafluoroethylene•hexafluoropropylene copolymer, an ethylene•tetrafluoroethylene copolymer, an ethylene•chlorotrifluoroethylene copolymer, polychlorotrifluoroethylene, polyvinylidene fluoride, and polyvinyl fluoride.

13. The chemical liquid storage body according to claim 9,
 wherein the container satisfies a condition 1 in a test described below,
 test: under a condition that a mass ratio of a mass of the container to a mass of a test solvent containing isopropanol at a proportion equal to or higher than 99.99% by mass becomes 0.1 in a case where a liquid temperature of the test solvent is set to be 25° C., the container is immersed in the test solvent with a liquid temperature of 25° C. for 48 hours,
 condition 1: in a case where the test solvent having been used for immersion contains one of organic impurities, an increase in a content of the organic impurities in the test solvent before and after the immersion is equal to or smaller than 1,000 mass ppm, and in a case where the test solvent having been used for immersion contains two or more of organic impurities, an increase in the total content of two or more of the organic impurities in the test solvent before and after the immersion is equal to or smaller than 1,000 mass ppm.

14. The chemical liquid storage body according to claim 9,
 wherein the container satisfies a condition 2 in a test described below,
 test: under a condition that a mass ratio of a mass of the container to a mass of a test solvent containing isopropanol at a proportion equal to or higher than 99.99% by mass becomes 1.0 in a case where a liquid temperature of the test solvent is set to be 25° C., the container is immersed in the test solvent with a liquid temperature of 25° C. for 48 hours,
 condition 2: in a case where the test solvent having been used for immersion contains one of metal ions, an increase in a content of the metal ions in the test solvent before and after the immersion is equal to or smaller than 100 mass ppb, and in a case where the test solvent having been used for immersion contains two or more of metal ions, an increase in the total content of two or more of the metal ions in the test solvent before and after the immersion is equal to or smaller than 100 mass ppb.

15. The chemical liquid storage body according to claim 9,
 wherein the container satisfies a condition 3 in a test described below,
 test: under a condition that a mass ratio of a mass of the container to a mass of a test solvent containing isopropanol at a proportion equal to or higher than 99.99% by mass becomes 1.0 in a case where a liquid temperature of the test solvent is set to be 25° C., the container is immersed in the test solvent with a liquid temperature of 25° C. for 48 hours,
 condition 3: in a case where the test solvent having been used for immersion contains one of metal particles, an increase in a content of the metal particles in the test solvent before and after the immersion is equal to or smaller than 100 mass ppb, and in a case where the test solvent having been used for immersion contains two or more of metal particles, an increase in the total content of two or more of the metal particles in the test solvent before and after the immersion is equal to or smaller than 100 mass ppb.

16. The chemical liquid storage body according to claim 9,
 wherein the container is formed of a composition that contains a polymer containing fluorine atoms and a nanocarbon material,
 provided that an integrated intensity of a peak resulting from C═C stretching vibration confirmed in a range of 1,500 to 1,800 $cm^{-1}$ is $I_1$ and an integrated intensity of a peak resulting from C—H stretching vibration confirmed in a range of 2,800 to 3,500 cm$^{-1}$ is $I_2$, $M_1$ represented by Formula (1): $M_1=I_1/(I_1+I_2)$ is 0.05 to 0.5, and the peaks are determined by atomic force microscopy infrared spectroscopy in at least a surface of a portion of the container.

17. The chemical liquid storage body according to claim 16, wherein an atom number ratio $X_1$ of the number of fluorine atoms contained in at least a surface of a portion of the container to the number of carbon atoms contained in the surface is 0.50 to 3.0, $X_1$ is measured by time-of-flight secondary ion mass spectrometry, provided that an integrated intensity of a peak resulting from C=C stretching vibration confirmed in a range of 1,500 to 1,800 cm$^{-1}$ is b and an integrated intensity of a peak resulting from C—H stretching vibration confirmed in a range of 2,800 to 3,500 cm$^{-1}$ is $I_4$, $M_2$ represented by Formula (3): $M_2=I_3/(I_3+I_4)$ satisfies Formula (4): $M_1<M_2$, and the peaks are determined using a scattering near field microscope in at least a surface of a portion of the container.

18. The chemical liquid storage body according to claim 16, wherein a content of the nanocarbon material with respect to the total mass of the composition is 0.001% to 0.5% by mass.

19. The chemical liquid storage body according to claim 16, wherein the nanocarbon material is carbon nanotubes.

20. The chemical liquid storage body according to claim 19, wherein a major axis of the carbon nanotubes is 0.01 to 1,000 μm.

21. The chemical liquid storage body according to claim 9, further comprising:

a lid put on the container.

* * * * *